United States Patent
Matsumura

(10) Patent No.: US 11,032,940 B2
(45) Date of Patent: Jun. 8, 2021

(54) COOLING PLATE, COOLING DEVICE, AND ELECTRONIC APPARATUS

(71) Applicant: FUJITSU LIMITED, Kawasaki (JP)

(72) Inventor: Takayoshi Matsumura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/785,005

(22) Filed: Feb. 7, 2020

(65) Prior Publication Data

US 2020/0296858 A1 Sep. 17, 2020

(30) Foreign Application Priority Data

Mar. 14, 2019 (JP) .............................. JP2019-047521

(51) Int. Cl.
*H05K 7/20* (2006.01)
*H01L 23/473* (2006.01)

(52) U.S. Cl.
CPC ....... *H05K 7/20254* (2013.01); *H01L 23/473* (2013.01); *H01L 23/4735* (2013.01); *H05K 7/20272* (2013.01)

(58) Field of Classification Search
CPC ................................................. H01L 23/4375
See application file for complete search history.

(56) References Cited

U.S. PATENT DOCUMENTS

| | | | |
|---|---|---|---|
| 5,016,090 A | 5/1991 | Galyon et al. | |
| 6,988,534 B2 * | 1/2006 | Kenny | F04B 17/00 165/104.21 |
| 7,000,684 B2 * | 2/2006 | Kenny | F04B 17/00 165/104.21 |
| 7,139,172 B2 * | 11/2006 | Bezama | F28F 3/04 361/699 |
| 7,190,580 B2 * | 3/2007 | Bezama | F28F 3/12 165/80.4 |
| 7,836,597 B2 * | 11/2010 | Datta | F28D 15/0266 29/890.041 |
| 8,047,273 B2 * | 11/2011 | Schubert | H01L 23/473 165/166 |
| 8,413,712 B2 * | 4/2013 | Brunschwiler | H01L 23/4735 165/80.2 |

(Continued)

FOREIGN PATENT DOCUMENTS

| | | |
|---|---|---|
| JP | H04-221843 A | 8/1992 |
| JP | 2017-004364 A | 1/2017 |

*Primary Examiner* — Robert J Hoffberg
(74) *Attorney, Agent, or Firm* — Fujitsu Patent Center

(57) ABSTRACT

A cooling plate includes: first comb tooth flow paths extending from a first common flow path; second comb tooth flow paths extending from a second common path; first vertical flow paths each of which extends from the first comb tooth flow path; second vertical flow paths each of which extends from the second comb tooth flow path; first outer flow paths each of which extends from the first vertical flow path; second outer flow paths that are alternately adjacent to the first outer flow path; first coupling flow paths each of which extends from the first comb tooth flow path or the first outer flow path; second coupling flow paths that are alternately adjacent to the first coupling flow path; and heat receiving flow paths each of which communicates with the first coupling flow path and the second coupling flow path to receive heat of the heat receiving surface.

6 Claims, 27 Drawing Sheets

(56) References Cited

U.S. PATENT DOCUMENTS

| | | | | |
|---|---|---|---|---|
| 8,464,781 B2* | 6/2013 | Kenny | ................... | F25B 21/02 |
| | | | | 165/80.4 |
| 9,061,382 B2* | 6/2015 | Campbell | .......... | H05K 7/20272 |
| 9,069,532 B2* | 6/2015 | Campbell | ................ | G06F 1/20 |
| 9,078,379 B2* | 7/2015 | Campbell | .......... | H05K 7/20318 |
| 10,443,957 B2* | 10/2019 | Kikuchi | ................ | F28F 9/0278 |
| 10,533,809 B1* | 1/2020 | Sherrer | ................... | F28F 13/12 |
| 2016/0366793 A1 | 12/2016 | Kikuchi et al. | | |

\* cited by examiner

COOLING PLATE, COOLING DEVICE, AND ELECTRONIC APPARATUS

CROSS-REFERENCE TO RELATED APPLICATION

This application is based upon and claims the benefit of priority of the prior Japanese Patent Application No. 2019-47521, filed on Mar. 14, 2019, the entire contents of which are incorporated herein by reference.

FIELD

The embodiments discussed herein are related to a cooling plate, a cooling device, and an electronic apparatus.

BACKGROUND

There is a cooling plate having a structure in which an inside of a main body is divided into an upper space and a lower space by a partition wall, and the upper space is comparted into a first flow path and a second flow path by a meandering compartment wall. In this cooling plate, the first flow path guides refrigerant in a first refrigerant storage portion toward a refrigerant outflow pipe, and flows the refrigerant to the lower space through a through-hole provided in the partition wall. The second flow path is configured to flow and store the refrigerant returning from the lower space through the through-hole provided in the partition wall in a direction of the refrigerant outflow pipe, and to send out the refrigerant to the refrigerant outflow pipe.

An example of the related art includes Japanese Laid-open Patent Publication No. 2017-4364.

SUMMARY

According to an aspect of the embodiments, a cooling plate includes: first comb tooth flow paths extending from a first common flow path to an inside of a flat surface parallel to a heat receiving surface in a comb-teeth shape; second comb tooth flow paths extending from a second common path to the inside of the flat surface in a comb-teeth shape and being alternately adjacent to the first comb flow paths; first vertical flow paths each of which extends from the first comb tooth flow path to a side of the heat receiving surface; second vertical flow paths each of which extends from the second comb tooth flow path to a side of the heat receiving surface; first outer flow paths each of which extends from the first vertical flow path to an outside of the flat surface; second outer flow paths each of which extending from the second vertical flow path to an outside of the flat surface and that are alternately adjacent to the first outer flow path; first coupling flow paths each of which extends from the first comb tooth flow path or the first outer flow path to a side of the heat receiving surface; second coupling flow paths each of which extends from the second comb tooth flow path or the second outer flow path to a side of the heat receiving surface and that are alternately adjacent to the first coupling flow path; and heat receiving flow paths each of which communicates with the first coupling flow path and the second coupling flow path to receive heat of the heat receiving surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT(S)

In a cooling plate having a structure in which a refrigerant flows through comb tooth flow paths, comb tooth flow paths at a refrigerant inflow side and comb tooth flow paths at a refrigerant outflow side may be alternately and adjacently arranged. In this case, each refrigerant flow path is provided so as to extend from a common flow path to an inside of a flat surface, and the refrigerant is branched from the common flow path and is joined to the common flow path. Since the common flow path extends in a direction crossing the comb tooth flow paths, it is impossible to extend the comb tooth flow paths beyond the common flow path. In other words, for example, there is a limit to extend the comb tooth flow paths to an outside of the flat surface of the cooling plate, and it is difficult to widen a region where cooling efficiency is high.

An object of the technology disclosed in the present application is to widen a region where cooling efficiency is high in a cooling plate, as one aspect.

In the technology disclosed in the present application, it is possible to widen a region having high cooling efficiency in a cooling plate.

A cooling plate according to a first embodiment, a cooling device having the cooling plate, and an electronic apparatus will be described in detail with reference to the drawings.

Figure 1:
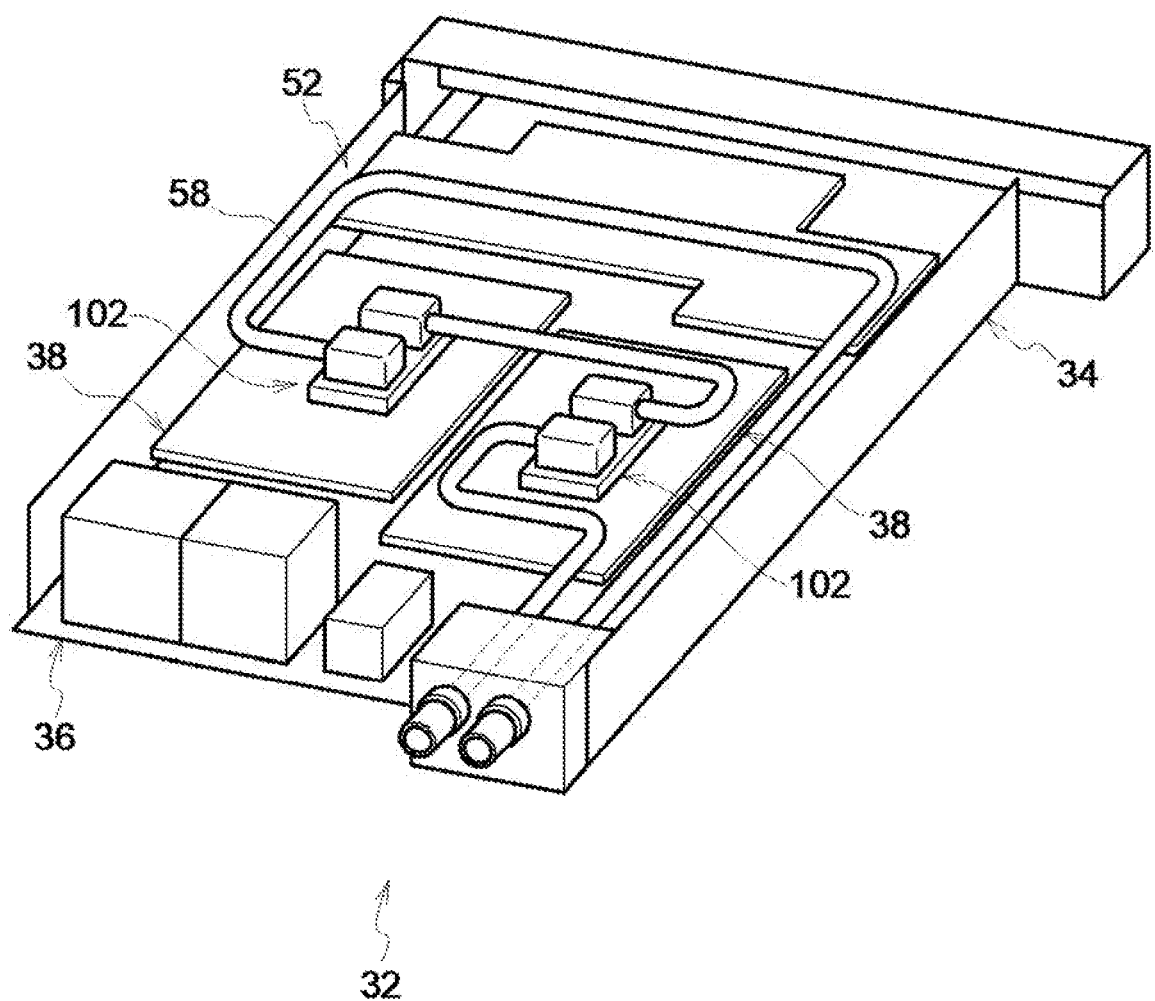
FIG. 1 is a perspective view illustrating an electronic apparatus according to a first embodiment.
Figure 3:
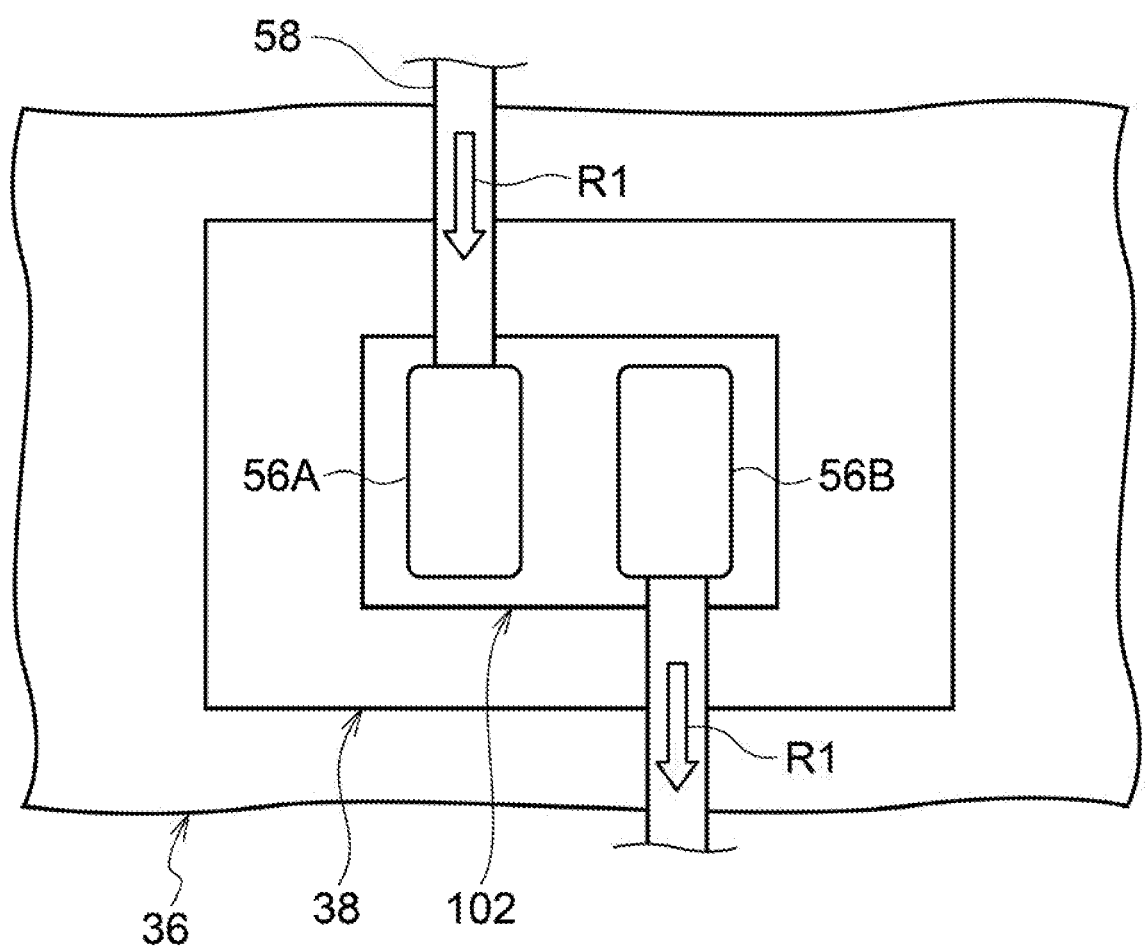
FIG. 3 is a plan view illustrating a cooling plate according to the first embodiment together with a part of the electronic apparatus.
Figure 4:
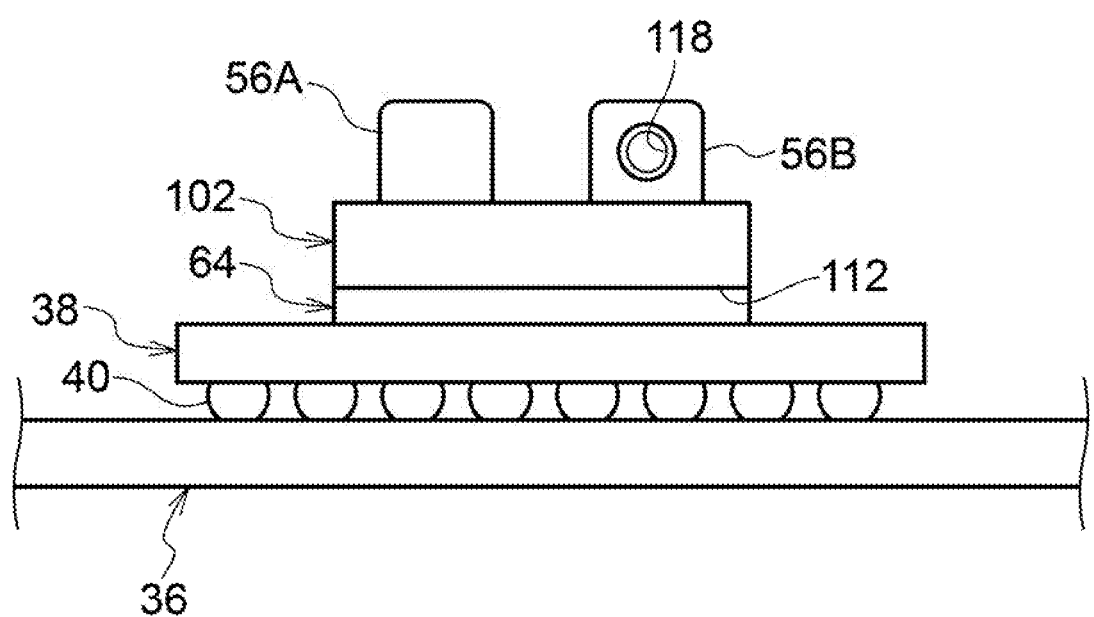
FIG. 4 is a front view illustrating the cooling plate according to the first embodiment together with a part of the electronic apparatus.

As illustrated in FIG. 1, an electronic apparatus 32 having cooling plates 102 according to the first embodiment includes a housing 34. A printed substrate 36 is accommodated in the housing 34. As illustrated in FIG. 3 and FIG. 4, a package substrate 38 is mounted on the printed substrate 36, and the package substrate 38 is electrically coupled to the printed substrate 36 by using coupling members 40 such as solder bumps or wire bonding. Although the two package substrates 38 are represented in the housing 34 in FIG. 1, the number of the package substrates 38 is not limited thereto.

As illustrated in FIG. 4, an electronic component 64 is mounted over the package substrate 38 and electrically coupled thereto by coupling members (not illustrated). The electronic component 64 is a component that generates heat during operation, and examples of the electronic component 64 may include a processor chip such as a central processing unit (CPU), or a graphics processing unit (GPU). The cooling plate 102 is brought into contact with the electronic component 64 with a bonding member such as a grease (e.g., thermal grease) interposed therebetween.

Figure 2:
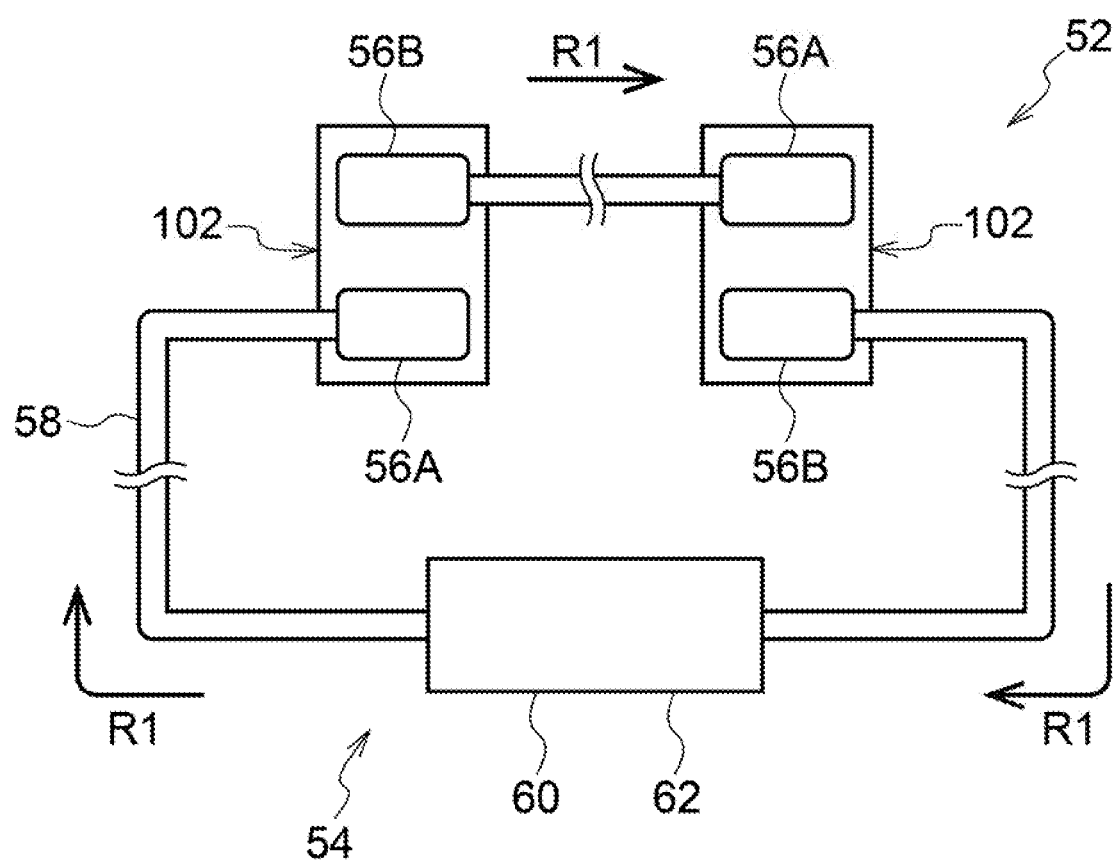
FIG. 2 is a plan view illustrating a cooling device according to the first embodiment.

As illustrated in FIG. 2, a cooling device 52 includes the cooling plate 102 and a circulation device 54, and the circulation device 54 includes covers 56A and 56B, a circulation pipe 58, a pump 60, and a chiller 62 which will be described later.

The pump 60 and the chiller 62 are provided in the circulation pipe 58, and the circulation pipe 58 is coupled to the cooling plate 102 by the covers 56A and 56B. By driving the pump 60, a refrigerant is circulated in the circulation pipe 58 as indicated by arrows R1, and the refrigerant is flowed into and out from the cooling plate 102.

The chiller 62 cools the refrigerant which receives heat and increases temperature over the cooling plate 102. In the example illustrated in FIG. 2, one pump 60 and one chiller 62 are provided for the two cooling plates 102. The two cooling plates 102, the pump 60, and the chiller 62 are coupled in series with the circulation pipe 58.

Figure 5:
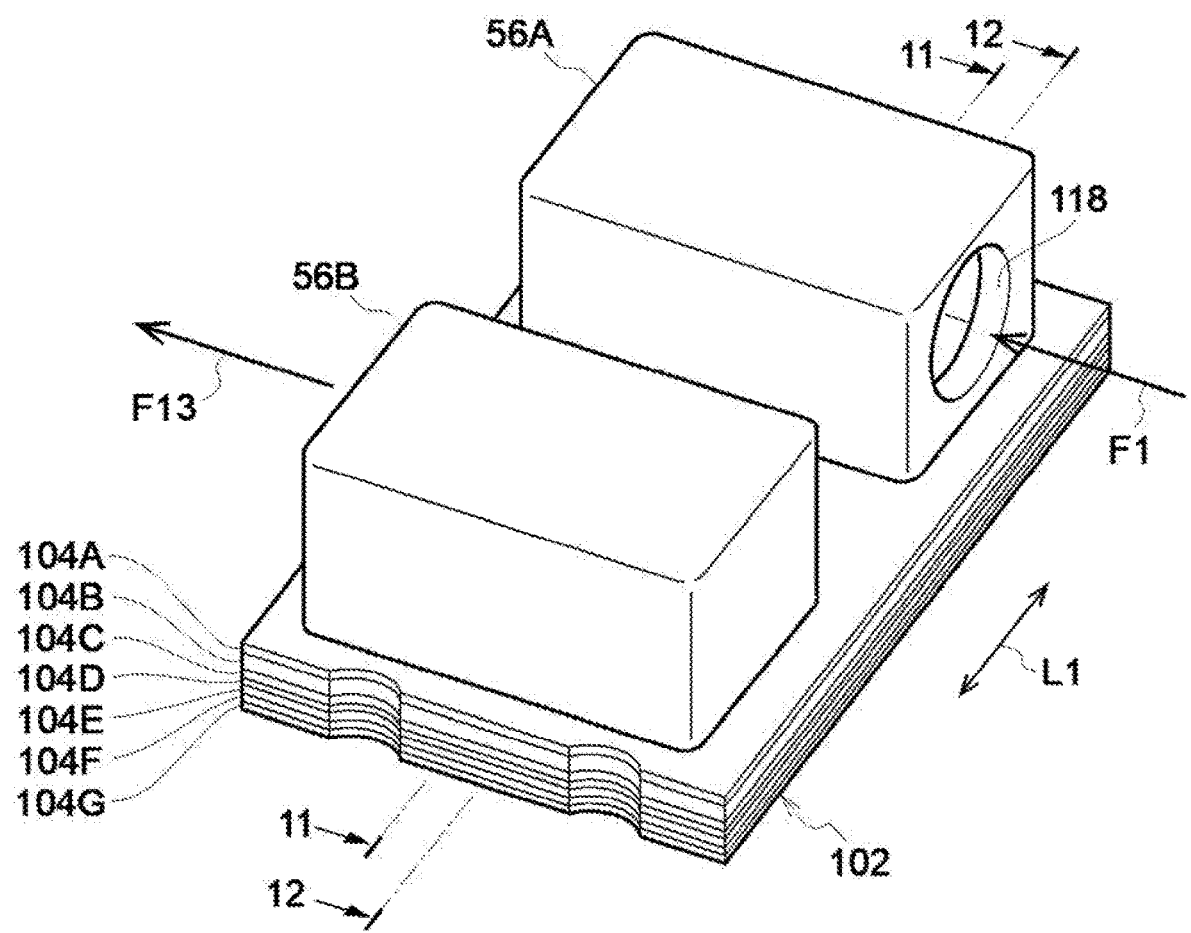
FIG. 5 is a perspective view illustrating the cooling plate according to the first embodiment in a state where covers are attached to the cooling plate.

As illustrated in FIG. 5, the cooling plate 102 includes a plurality of layer plates 104A to 104G having a plate shape (seven layer plates in the present embodiment). Each of the layer plates 104A to 104G has a rectangular shape in a plan view, and the layer plates 104A to 104G are overlapped in a thickness direction.

Figure 11:
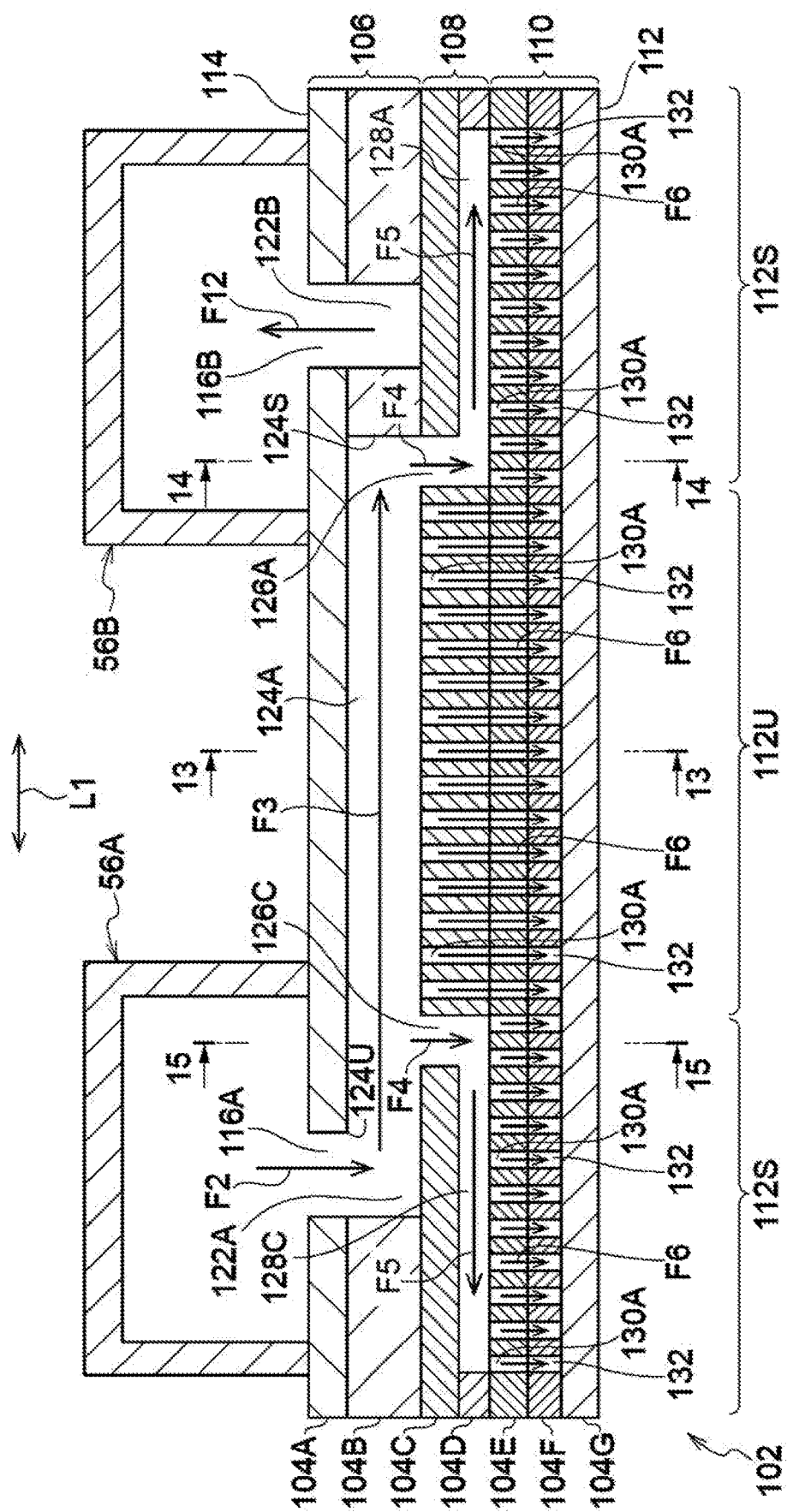
FIG. 11 is a cross-sectional view taken along line 11-11 in FIG. 5, and illustrates the cooling plate according to the first embodiment in the state where the covers are attached to the cooling plate.

The two layer plates 104A and 104B located at an upper side form a comb tooth flow path plate 106 illustrated in FIG. 11. Two layer plates 104C and 104D located under the comb tooth flow path plate 106 form an outer flow path plate 108. Three layer plates 104E, 104F, and 104G located under the outer flow path plate 108 form a heat receiving plate 110. As illustrated in FIG. 11, a lower surface of the heat receiving plate 110 is a heat receiving surface 112 that receives heat from the electronic component 64 (see FIG. 4). In the following, a flat surface of the cooling plate 102 is a surface parallel to the heat receiving surface 112, and is, for example, a top surface 114 opposite to the heat receiving surface 112.

Figure 6:
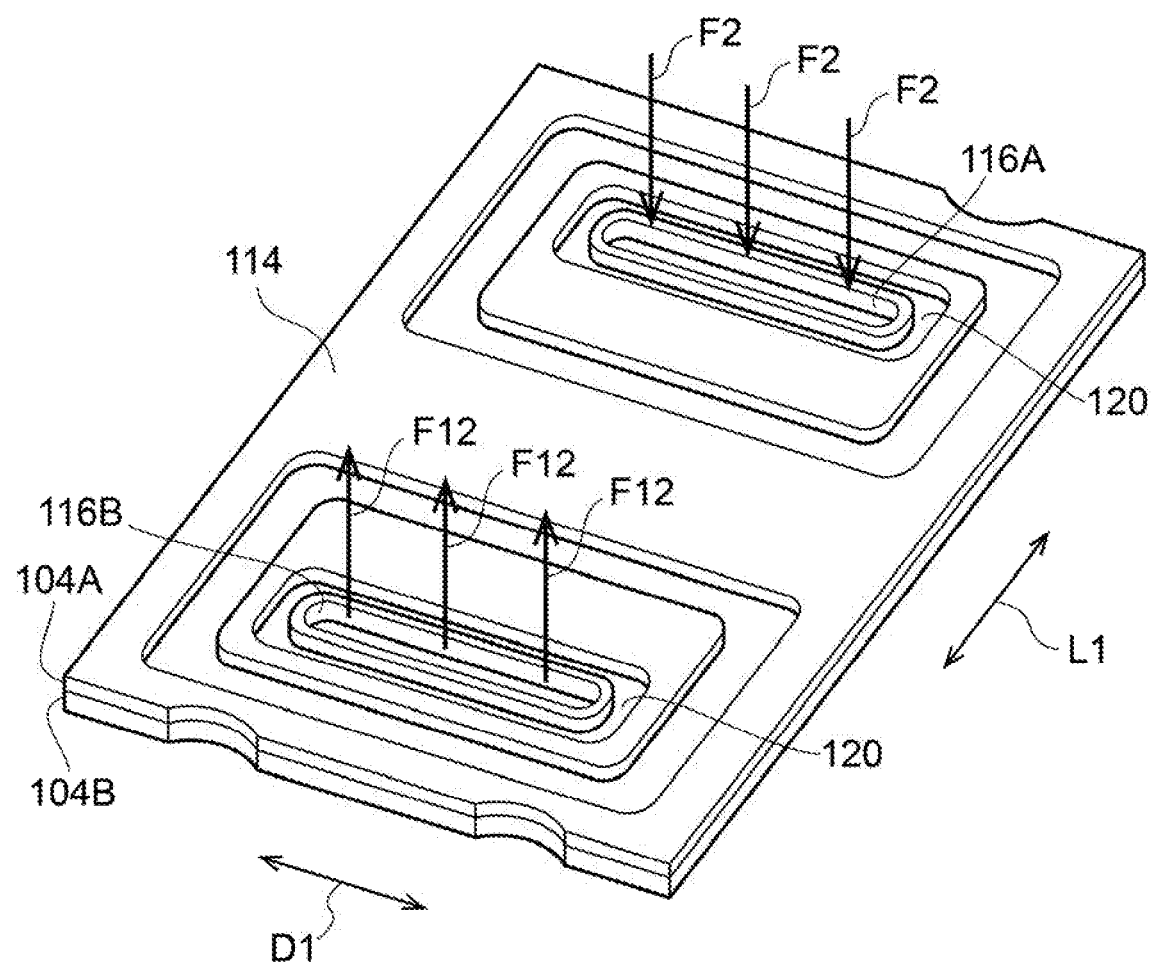
FIG. 6 is a perspective view illustrating layer plates that are a part of the cooling plate according to the first embodiment.

As illustrated in FIG. 6, the layer plate 104A is formed with two long holes 116A and 116B that penetrate in a plate thickness direction. In this embodiment, each of the two long holes 116A and 116B is formed so as to extend in a short-length direction of the layer plate 104A (in a direction indicated by an arrow D1). The two long holes 116A and 116B are formed parallel to each other at an interval in a longitudinal direction of the layer plate 104A (in the direction indicated by the arrow L1).

The covers 56A and 56B are attached to the layer plate 104A so as to respectively cover the long holes 116A and 116B from the peripheries thereof. Each of the covers 56A and 56B is a member having a rectangular parallelepiped shape, a portion thereof (lower surface) facing the layer plate 104A is opened and an entrance and exit hole 118 is formed at one of side surfaces thereof. The circulation pipe 58 (see FIG. 2) is coupled to the entrance and exit hole 118. As the refrigerant circulates, the refrigerant flows into an inside of the cover 56A from the entrance and exit hole 118 of one cover 56A as indicated by an arrow F1 in FIG. 5. As indicated by an arrow F2 in FIG. 6, the refrigerant flows into the cooling plate 102 from the corresponding long hole 116A. By circulating the refrigerant, the refrigerant flows out from the long hole 116B of the cooling plate 102 as indicated by an arrow F12 in FIG. 11 and FIG. 12, and flows into an inside of the cover 568. As indicated by an arrow F13 in FIG. 5, the refrigerant flows out from the entrance and exit hole 118 of the cover 56B toward the circulation pipe 58.

In the present embodiment, as illustrated in FIG. 6, the layer plate 104A is provided with recessed portions 120 each of which the covers 56A and 56B are individually fitted into. The covers 56A and 56B are individually fitted into the recessed portions 120, and are fixed to the layer plate 104A by, for example, bonding, welding, fusion bonding, or the like. Since the covers 56A and 56B are fixed to the top surface 114 of the cooling plate 102, the covers 56A and 56B may be firmly fixed in a large area.

Figure 7:
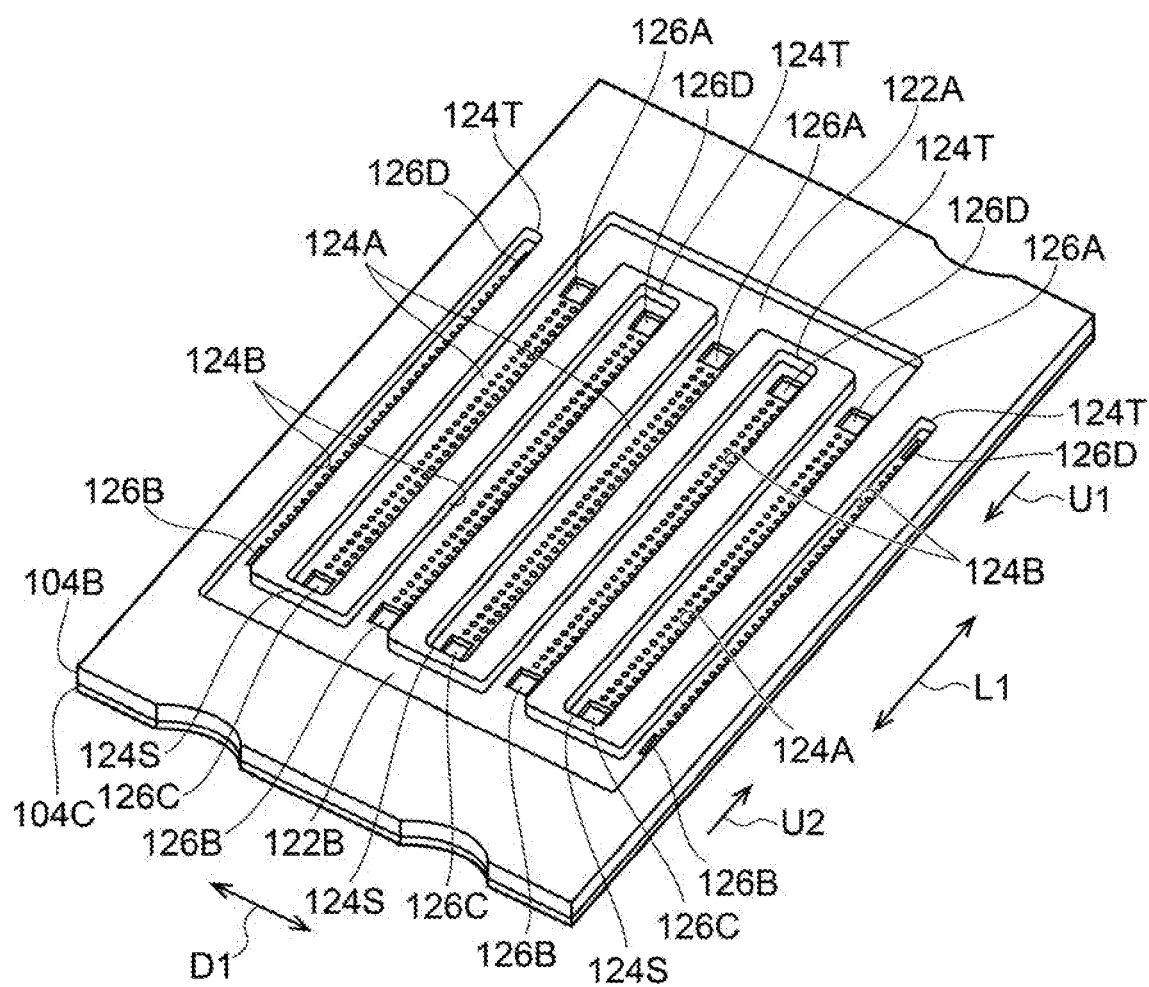
FIG. 7 is a perspective view illustrating layer plates that are a part of the cooling plate according to the first embodiment.

As illustrated in FIG. 7, the layer plate 104B is formed with a first common flow path 122A and a second common flow path 122B corresponding to the long holes 116A and 116B, respectively. Both the first common flow path 122A and the second common flow path 122B are parallel to the heat receiving surface 112 and extend in a short-length direction (the direction indicated by the arrow D1) of the layer plate 104B.

From the first common flow path 122A, a plurality of comb tooth flow paths 124A that has a comb-teeth shape extends toward an inner side of a flat surface parallel to the heat receiving surface 112 (that is, in a direction indicated by an arrow U1). From the second common flow path 122B, a plurality of comb tooth flow paths 124B that has a comb-teeth shape and that extends toward the inner side in the same manner as the first comb tooth flow paths 124A (however, in an opposite direction to the first comb tooth flow paths 124A, in a direction indicated by an arrow U2).

Figure 12:
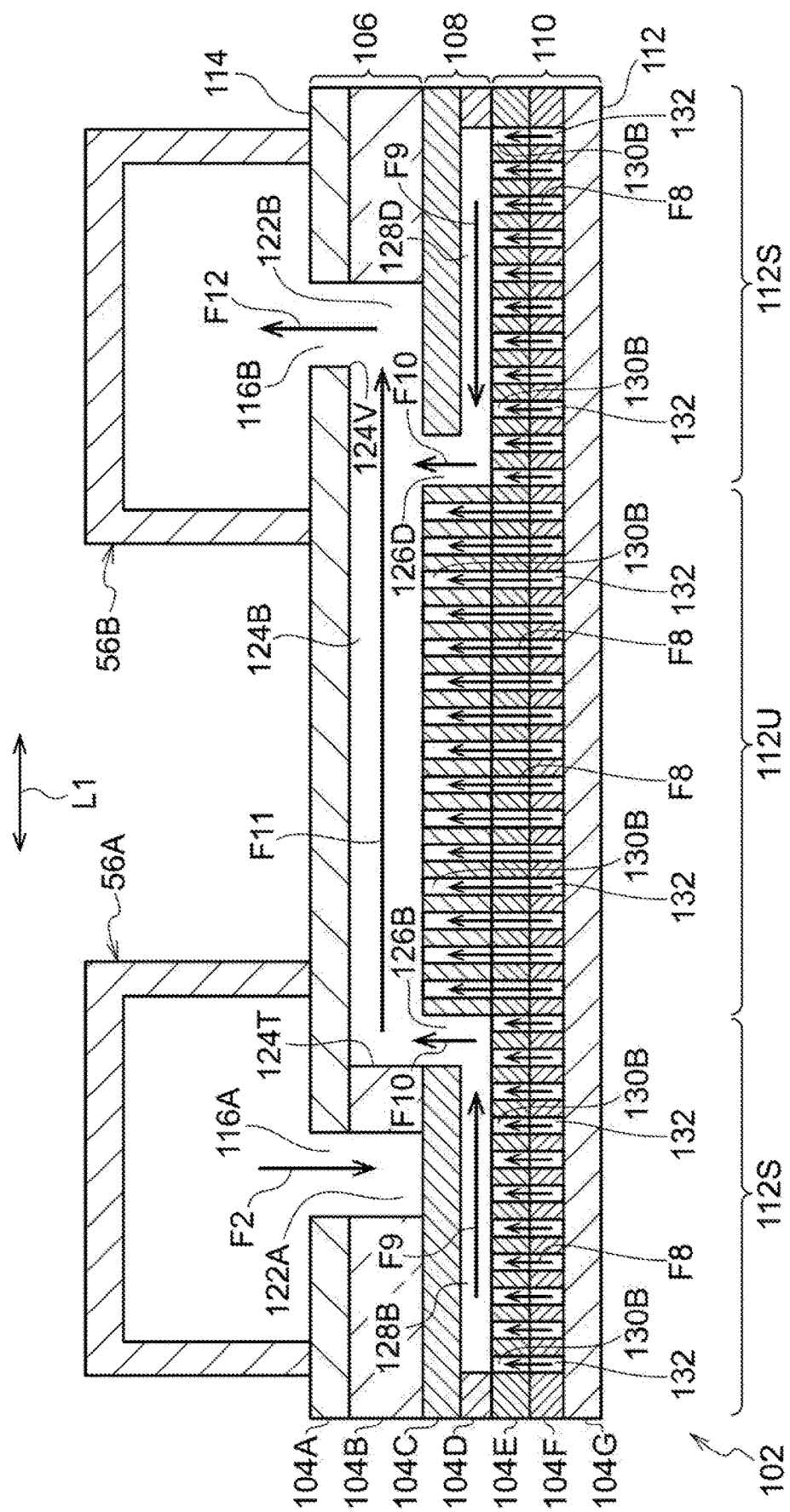
FIG. 12 is a cross-sectional view taken along line 12-12 in FIG. 5, and illustrates the cooling plate according to the first embodiment in the state where the covers are attached to the cooling plate.

As Illustrated in FIG. 11, tip ends 124S of the first comb tooth flow paths 124A are located before reaching the second common flow path 122B. Similarly, as illustrated in FIG. 12, tip ends 124T of the second comb tooth flow path 124B are located before reaching the first common flow path 122A. That is, positions of the tip ends 124S of the first comb tooth flow paths 124A are limited by the second common flow path 122B, and positions of the tip ends 124T of the second comb tooth flow paths 124B are limited by the first common flow path 122A. In this embodiment, the number of the first comb tooth flow paths 124A is three, and the number of the second comb tooth flow paths 124B is four. The second comb tooth flow paths 124B that are at both ends in the short-length direction (in the direction indicated by the arrow D1) of the layer plate 104B are narrower than the other second comb tooth flow paths 124B.

Figure 13:
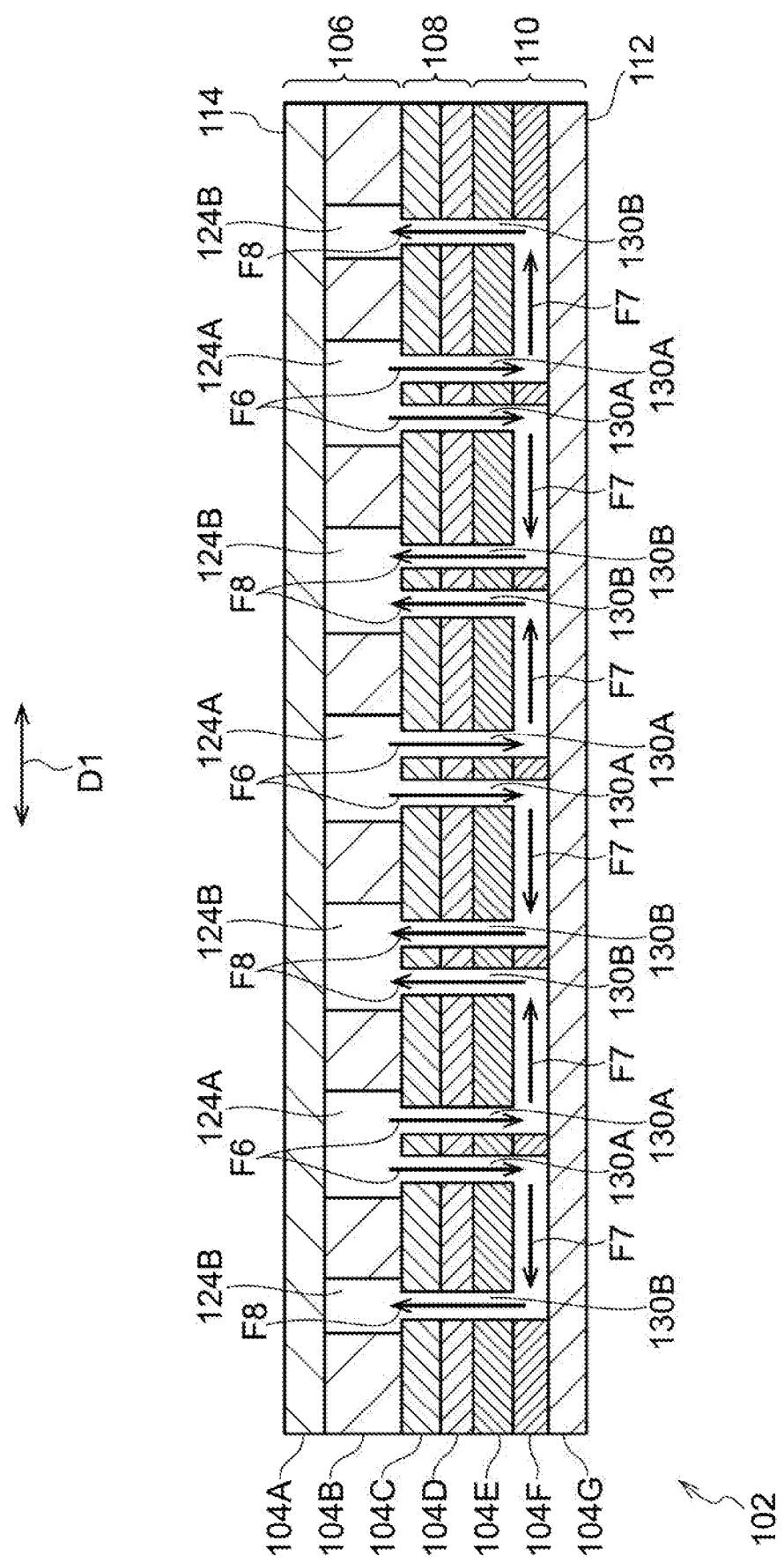
FIG. 13 is a cross-sectional view taken along line 13-13 in FIG. 11, and illustrates the cooling plate according to the first embodiment in the state where the covers are attached to the cooling plate.
Figure 14:
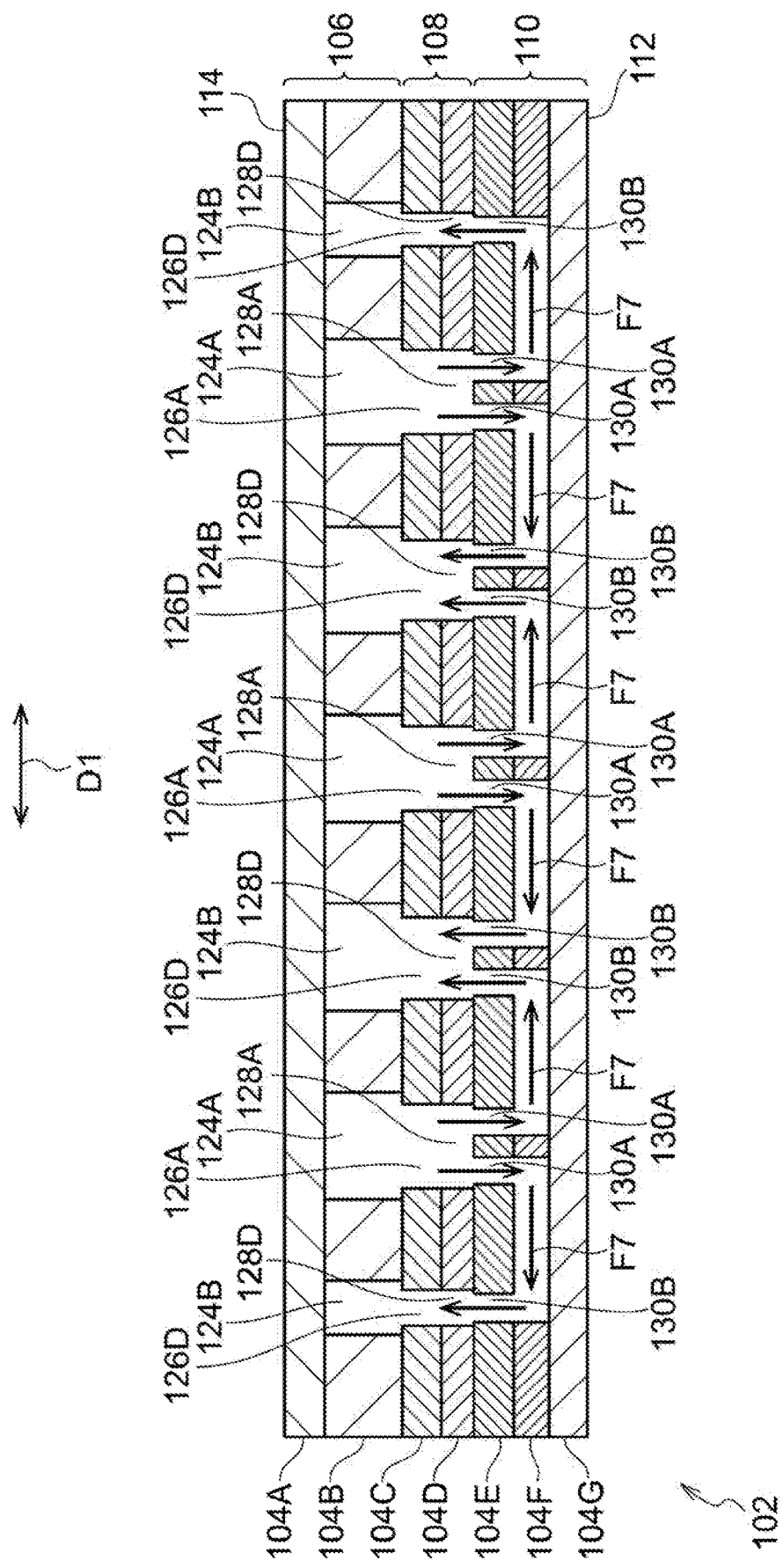
FIG. 14 is a cross-sectional view taken along line 14-14 in FIG. 11, and illustrates the cooling plate according to the first embodiment in the state where the covers are attached to the cooling plate.
Figure 15:
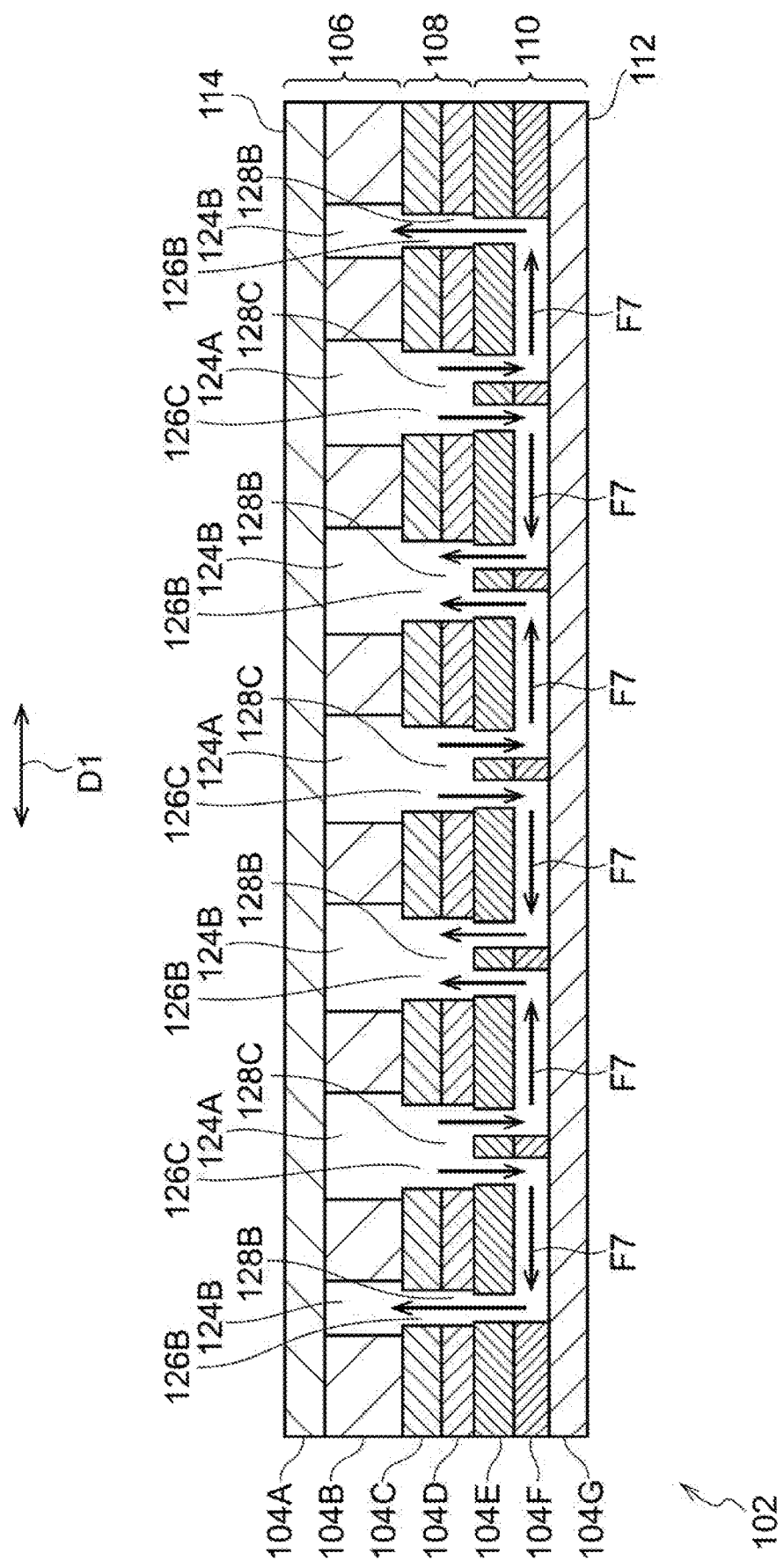
FIG. 15 is a cross-sectional view taken along line 15-15 in FIG. 11, and illustrates the cooling plate according to the first embodiment in the state where the covers are attached to the cooling plate.

As illustrated in FIG. 13 to FIG. 15, each of the first comb tooth flow path 124A and the second comb tooth flow path 124B are alternately adjacent to each other with a part of the layer plate 104B as a wall.

As illustrated in FIG. 11, in the layer plate 104C, first vertical flow paths 126A and 126C that penetrate the layer plate 104C in a thickness direction are formed at a position at the tip end 124S side of the first comb tooth flow path 124A and at a position at a base end 124U side (an end portion close to the first common flow path 122A) of the first comb tooth flow path 124A, respectively. As illustrated in FIG. 12, in the layer plate 104C, second vertical flow paths 126B and 126D that penetrate the layer plate 104C in the thickness direction are formed at a position at the tip end 124T side of the second comb tooth flow path 124B and at a position at a base end 124V side of the second comb tooth flow path 124B, respectively. The first vertical flow paths 126A and 126C are flow paths extending from the first comb tooth flow path 124A toward the heat receiving surface 112 side, and the second vertical flow paths 126B and 126D are flow paths extending from the second comb tooth flow path 124B toward the heat receiving surface 112 side.

As illustrated in FIG. 14, the first vertical flow path 126A and the second vertical flow path 126D are adjacent to each other with a part of the layer plate 104C as a wall. Similarly, as illustrated in FIG. 15, the first vertical flow path 126C and the second vertical flow path 126B are adjacent to each other with a part of the layer plate 104C as a wall.

Figure 8:
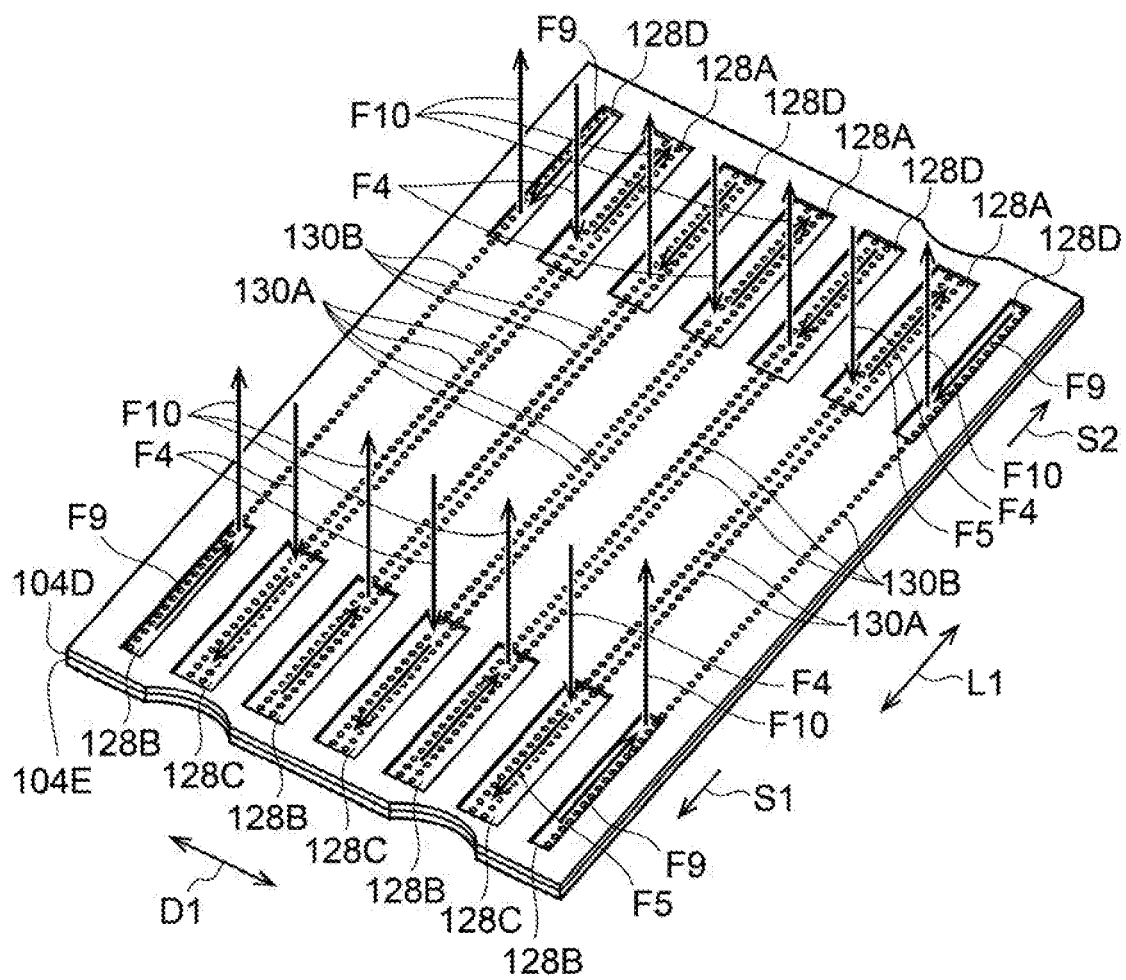
FIG. 8 is a perspective view illustrating layer plates that are a part of the cooling plate according to the first embodiment.

As Illustrated in FIG. 8, in the layer plate 104D, first outer flow paths 128A and 128C respectively extending from the first vertical flow paths 126A and 126C toward an outside of a flat surface parallel to the heat receiving surface 112 (in a direction indicated by an arrow S1 or in a direction indicated by an arrow S2) are formed. In the layer plate 104D, second outer flow paths 128B and 128D respectively extending from the second vertical flow paths 126B and 126D toward the outside of the flat surface parallel to the heat receiving surface 112 (in the direction indicated by the arrow S2 or in the direction indicated by the arrow S1) are formed.

As illustrated in FIG. 14, the first outer flow path 128A and the second outer flow path 128D are adjacent to each other with a part of the layer plate 104D as a wall. Similarly, as illustrated in FIG. 15, the first outer flow path 128C and the second outer flow path 128B are adjacent to each other with a part of the layer plate 104D as a wall.

As illustrated in FIG. 11, in the layer plates 104C, 104D, and 104E, first coupling flow paths 130A that penetrate the layer plates 104C, 104D, and 104E in the thickness direction are formed at positions corresponding to the first comb tooth flow paths 124A.

Similarly, as illustrated in FIG. 12, in the layer plates 104C, 104D, and 104E, second coupling flow paths 130B that penetrate the layer plates 104C, 104D, and 104E in the thickness direction are formed at positions corresponding to the second comb tooth flow paths 124B.

In the layer plate 104E, the first coupling flow paths 130A that penetrate the layer plate 104E in the thickness direction are formed at positions corresponding to the first outer flow paths 128A and 128C. Therefore, the first coupling flow paths 130A penetrate the layer plate 104E from the first outer flow paths 128A and 128C and extend to the heat receiving surface 112 side in regions (outer regions 112S) where the first outer flow paths 128A and 128C are formed.

Similarly, in the layer plate 104E, the second coupling flow paths 130B that penetrate the layer plate 104E in the thickness direction are formed at positions corresponding to the second outer flow paths 128B and 128D. Accordingly, the second coupling flow paths 130B penetrate the layer plate 104E from the second outer flow paths 128B and 128D and extend to the heat receiving surface 112 side in regions (outer regions 112S) where the second outer flow paths 128B and 128D are formed.

The number of the first coupling flow paths 130A and the number of the second coupling flow paths 130B are equal to each other, and the number thereof is also equal to the number of heat receiving flow paths 132 to be described later.

Figure 9:
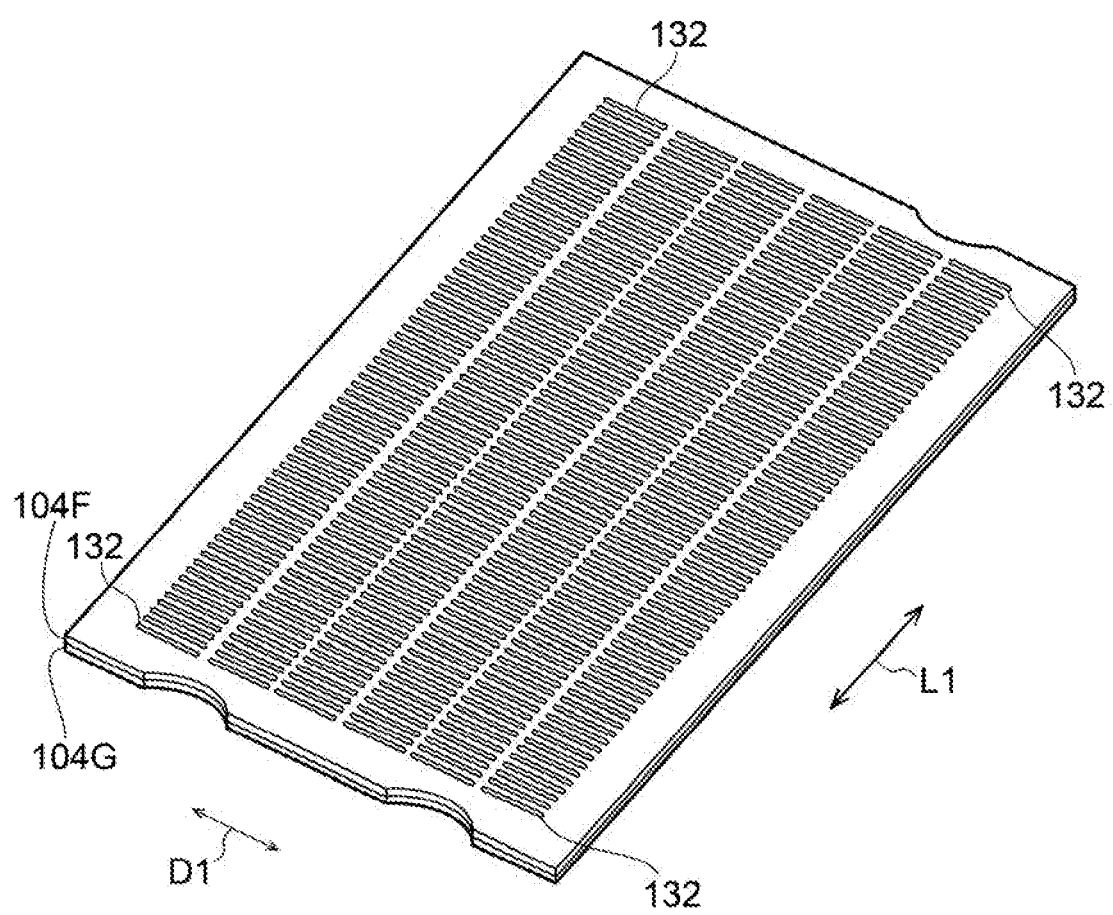
FIG. 9 is a perspective view illustrating layer plates that are a part of the cooling plate according to the first embodiment.

As Illustrated in FIG. 9, heat receiving flow paths 132 are formed in the layer plate 104F. Each of the heat receiving flow paths 132 extends in a short-length direction (in the direction indicated by the arrow D1) of the layer plate 104G and the heat receiving flow paths 132 are arranged in the short-length direction and in a longitudinal direction (in the direction indicated by the arrow L1). The first coupling flow paths 130A correspond one to one to the second coupling flow paths 130B. The first coupling flow path 130A is coupled to one end portion, in an extending direction, of the heat receiving flow path 132, and the second coupling flow path 130B is coupled to the other end portion. As illustrated in FIG. 11 and FIG. 12, the heat receiving flow paths 132 are provided not only in an inner region 112U but also in the outer regions 112S. The inner region 112U is a region corresponding to the first comb tooth flow paths 124A or the second comb tooth flow paths 124B, and the outer regions 112S are regions corresponding to any of the first outer flow paths 128A, 128B, 128C, and 128D.

The layer plate 104G covers the heat receiving flow paths 132 by making contact with the layer plate 104F, and a structure is substantially obtained in which the refrigerant flows through the heat receiving flow paths 132. The lower surface of the layer plate 104G is the heat receiving surface 112, and heat received by the heat receiving surface 112 acts on the refrigerant flowing through the heat receiving flow paths 132.

Next, an operation of the present embodiment will be described in comparison with a comparative example.

In the cooling device 52 according to the present embodiment, as indicated by an arrow R1 in FIG. 2, the refrigerant may be circulated by driving the pump 60. The refrigerant circulated in this manner flows into the inside of the cover 56A as indicated by the arrow F1 in FIG. 5. As indicated by the arrow F2 in FIG. 6, FIG. 11, and FIG. 12, the refrigerant flowing into the cover 56A passes through the long hole 116A and flows into an inside of the cooling plate 102. A structure in which the refrigerant flows in the opposite direction to the arrow R1 in FIG. 2 may also be adopted. In this case, the refrigerant flows into an inside of the cover 56B, and flows out from the cover 56A.

As indicated by an arrow F3 in FIG. 11, the refrigerant flowing into the inside of the cover 56A branches and flows from the first common flow path 122A into the first comb tooth flow paths 124A. A part of the refrigerant flows from the first vertical flow paths 126A and 126C to the first outer flow paths 128A and 128C, as indicated by arrows F4 and F5.

Figure 10:
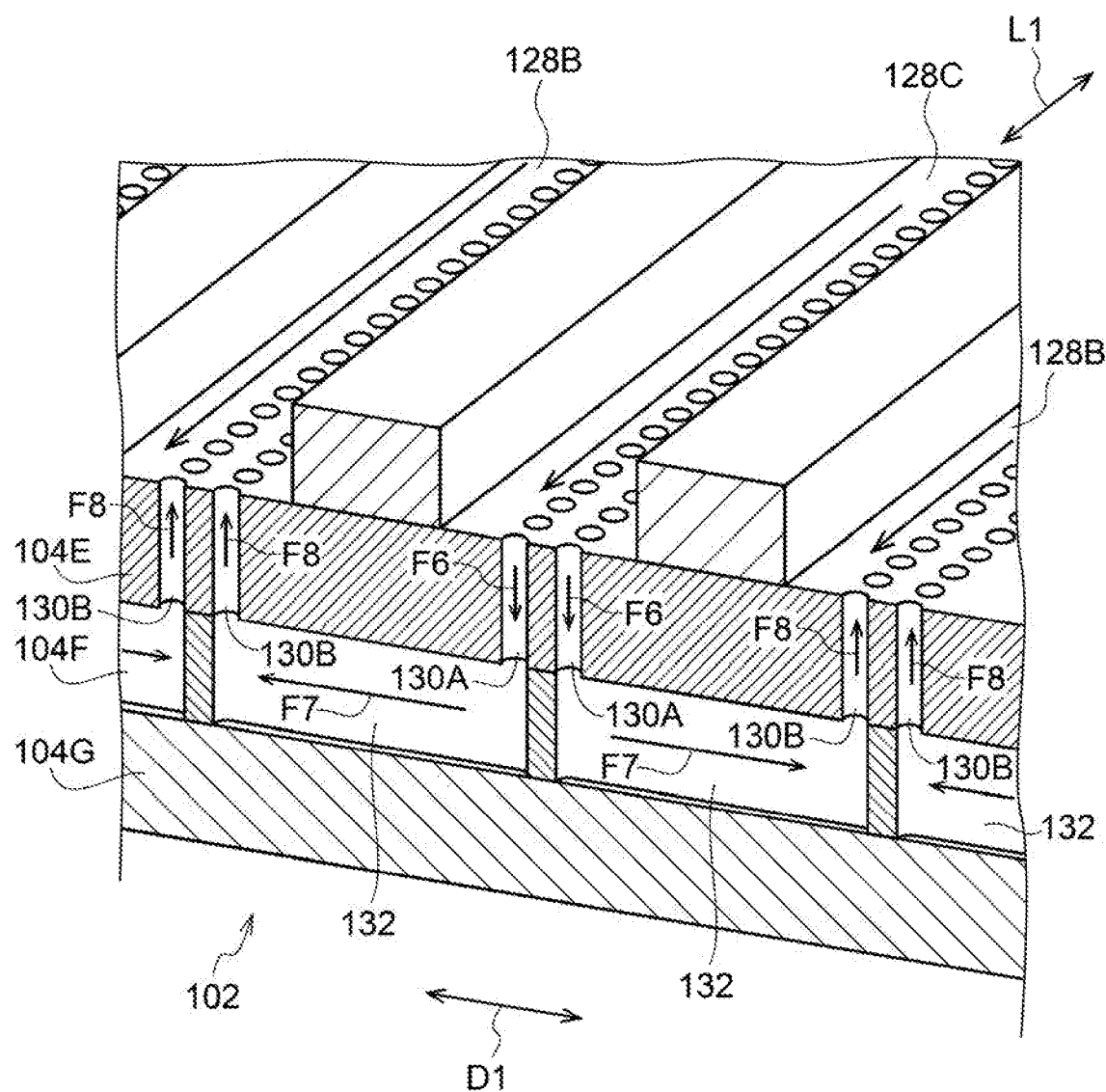
FIG. 10 is a perspective view illustrating the cooling plate according to a first embodiment in a state where the cooling plate is partly broken.

The refrigerant inside the first comb tooth flow path 124A or the first outer flow path 128A passes through the first coupling flow paths 130A and flows in the heat receiving flow paths 132, as indicated by arrows F6 and F7 in FIG. 10. In the heat receiving flow path 132, the refrigerant receives heat of the electronic component 64 (see FIG. 4).

The refrigerant having the temperature raised by receiving heat in the heat receiving flow path 132 flows from the second coupling flow path 130B to the second comb tooth flow path 124B or the second outer flow path 128B or 128D, as indicated by an arrow F8 in FIG. 10 and FIG. 12. As indicated by arrows F9 and F10, the refrigerant flowing to the second outer flow path 128B or 128D flows from the second vertical flow path 126B or 126D to the second comb tooth flow path 124B. The refrigerant joins together, passes through the second common flow path 122B and the long hole 116B, flows into the cover 56B as indicated by arrows F11 and F12, and returns to the circulation pipe 58. In this manner, since the refrigerant is circulated in the cooling device 52 to receive the heat of the electronic component 64, the electronic component 64 is cooled.

Figure 16:
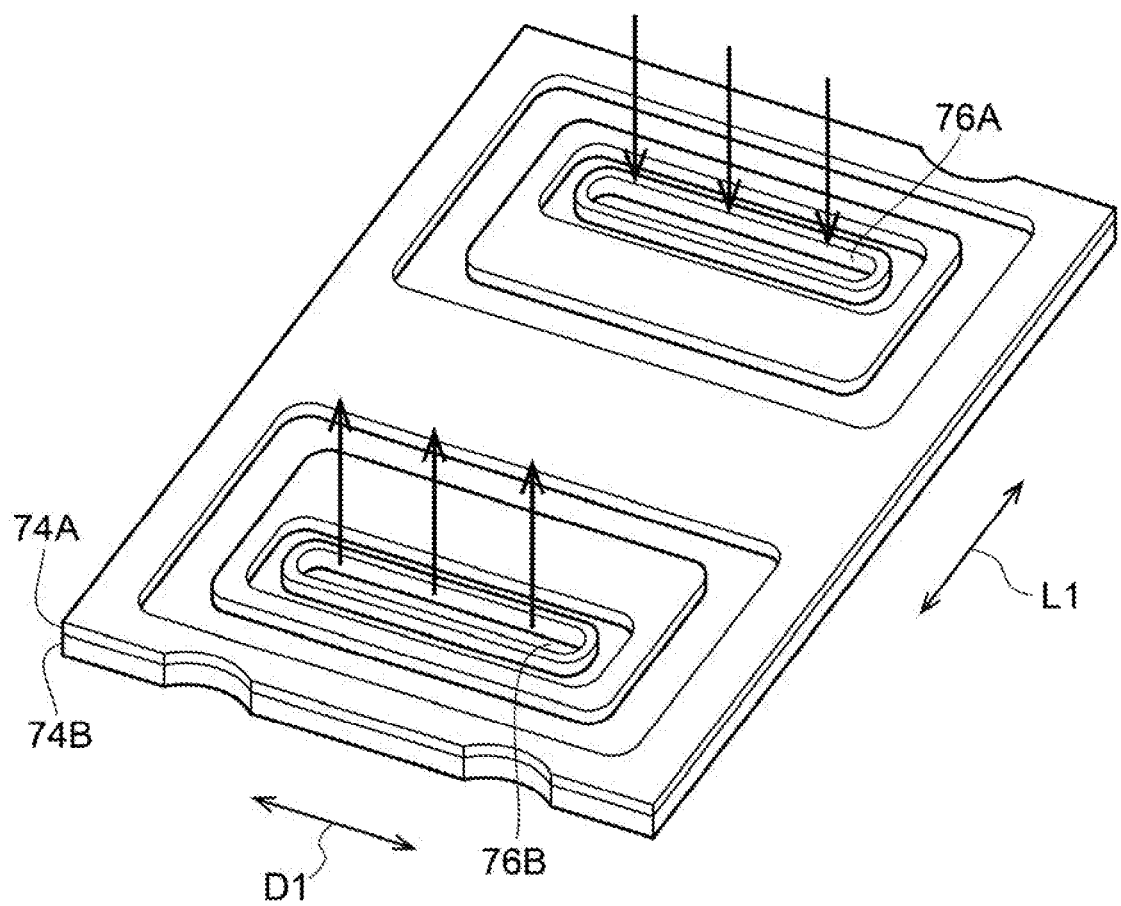
FIG. 16 is a perspective view illustrating layer plates that are a part of a cooling plate according to a comparative example.
Figure 17:
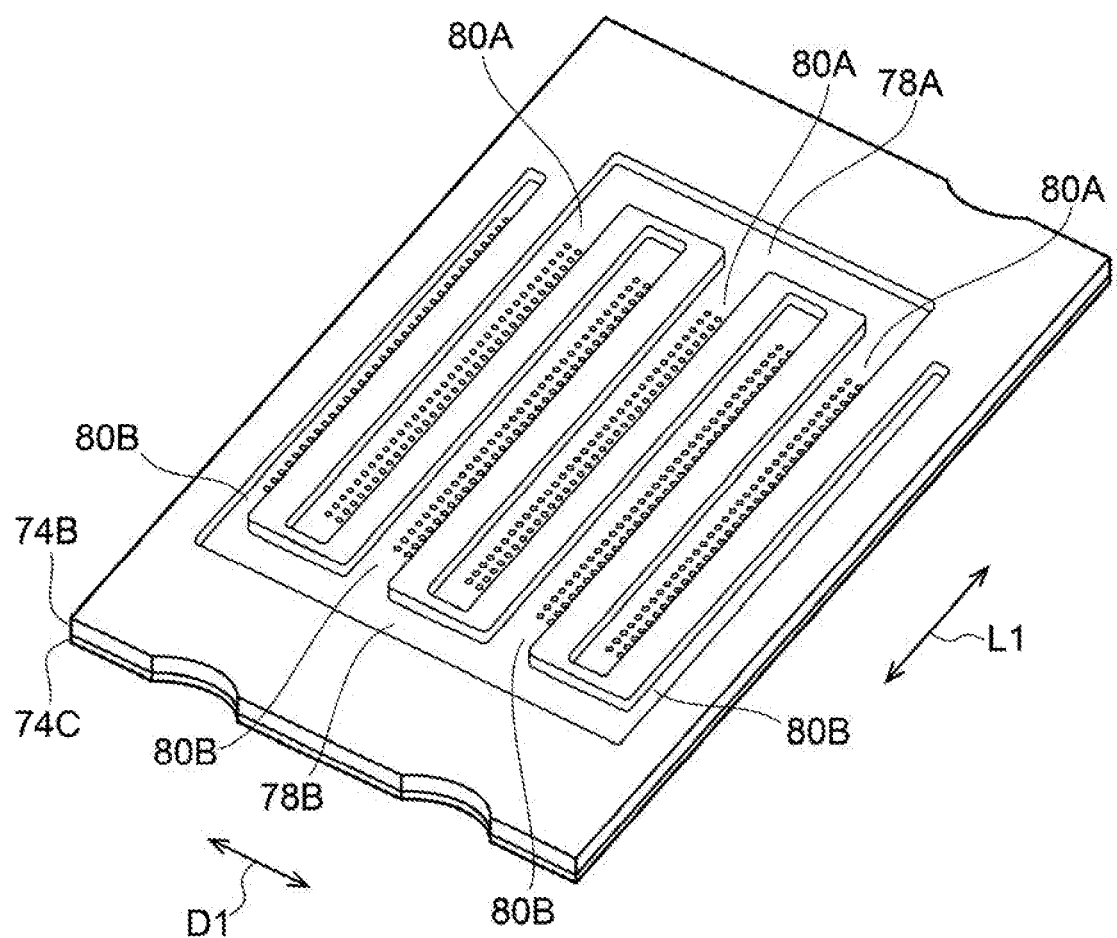
FIG. 17 is a perspective view illustrating layer plates that are a part of the cooling plate according to the comparative example.
Figure 18:
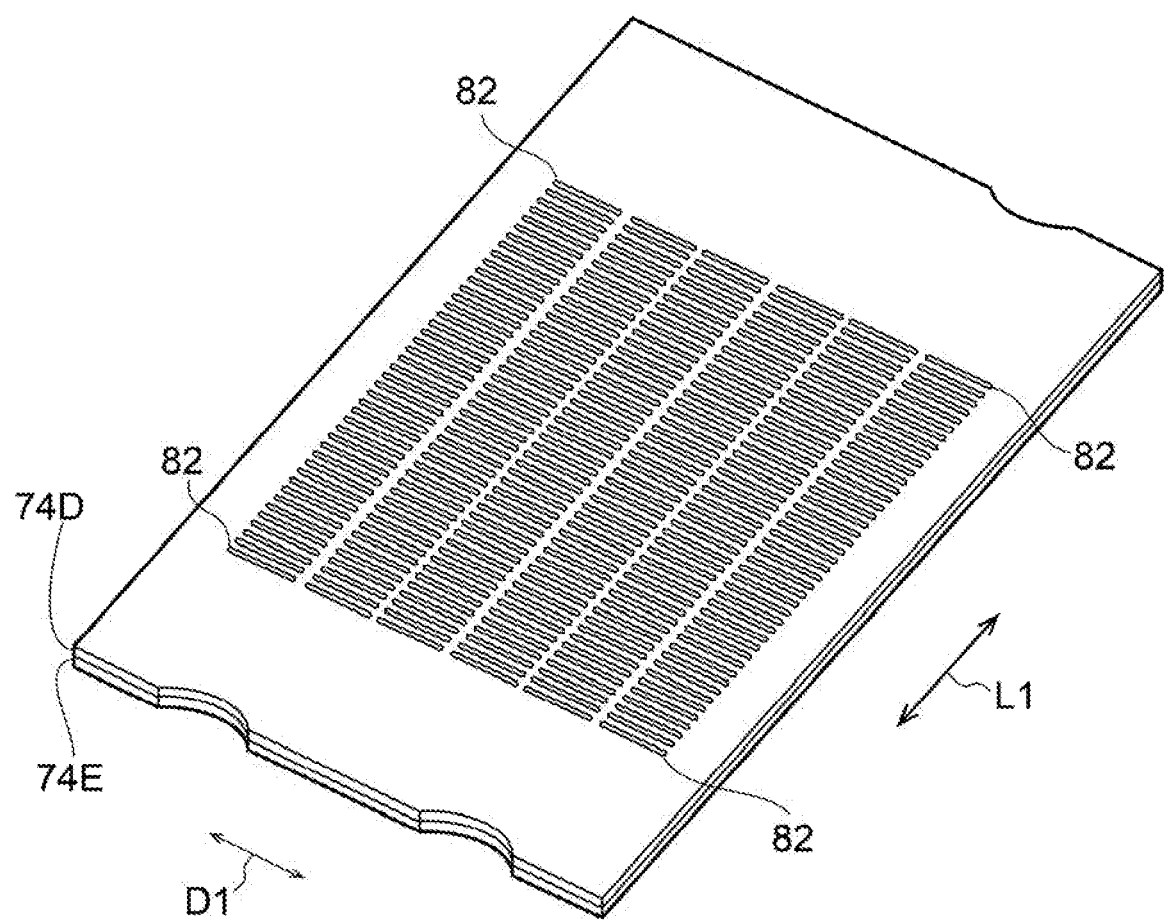
FIG. 18 is a perspective view illustrating layer plates that are a part of the cooling plate according to the comparative example.

Each of FIG. 16 to FIG. 20 illustrates a cooling plate 72 according to the comparative example. The cooling plate 72 according to the comparative example includes five layer plates 74A to 74E. As illustrated in FIG. 16, long holes 76A and 76B similar to those in the first embodiment are formed in the layer plate 74A. As illustrated in FIG. 17, in the layer plate 74B, first comb flow paths 80A extend from a first common flow path 78A, and second comb tooth flow paths 80B extend from a second common flow path 78B, but the first vertical flow path 126A, the second vertical flow path 126B, the first outer flow path 128A, and the second outer flow path 128B (see FIG. 7, FIG. 8, and FIG. 11 to FIG. 15) as in the first embodiment are not provided. Also in the cooling plate according to the comparative example, heat receiving flow paths 82 are provided in the layer plate 74D, and the heat receiving flow paths 82 are covered with the layer plate 74E.

Figure 19:
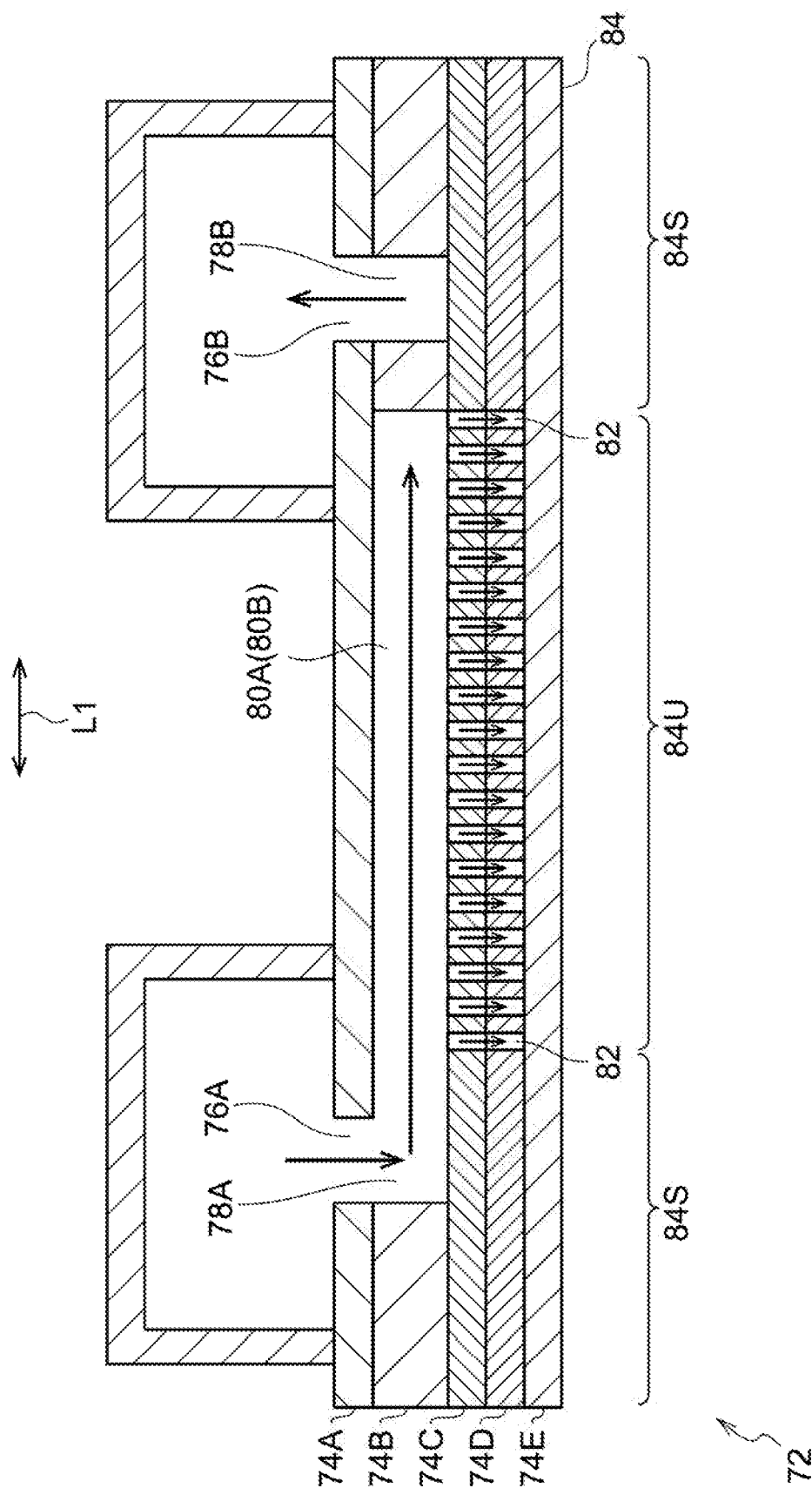
FIG. 19 is a cross-sectional view illustrating the cooling plate according to the comparative example in a state where covers are attached to the cooling plate.
Figure 20:
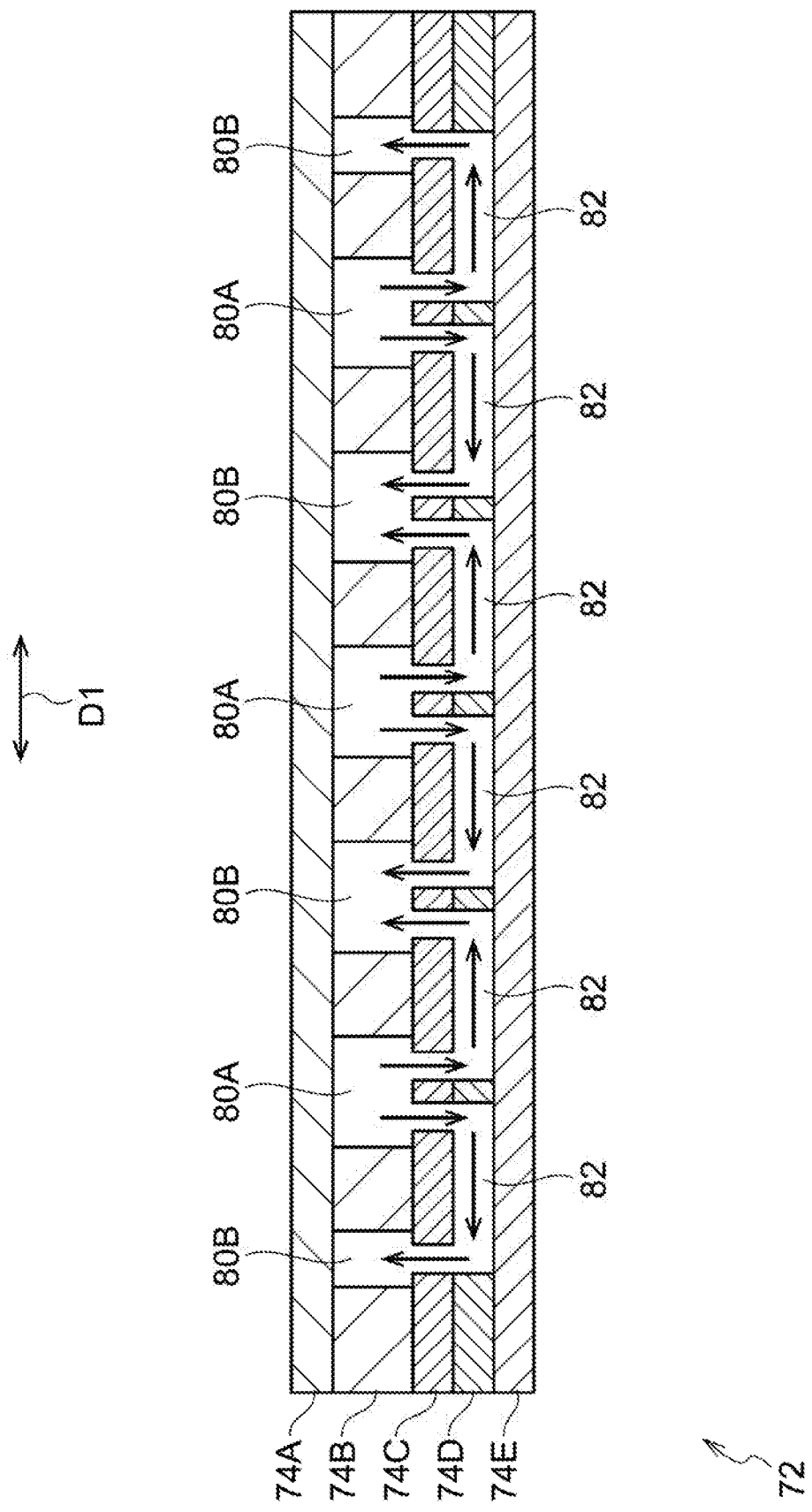
FIG. 20 is a cross-sectional view illustrating the cooling plate according to the comparative example.

In the cooling plate 72 according to the comparative example, as may be seen from FIG. 19, in an inner region 84U (a region corresponding to the first comb tooth flow path 80A or the second comb tooth flow path 80B) that is a flat surface parallel to the heat receiving surface 84, the heat receiving flow paths 82 are provided, so that refrigerant may flow into the heat receiving flow paths 82. However, the heat receiving flow path 82 is not provided in outer regions 84S, and cooling efficiency in the outer regions 84S is lower than that in the inner region 84U.

On the other hand, in the cooling plate 102 according to the first embodiment, as may be seen from FIG. 11 and FIG. 12, the refrigerant also flows in the heat receiving flow paths 132 provided in the outer regions 112S. Therefore, in the cooling plate 102 according to the present embodiment, as compared with the cooling plate 72 according to the comparative example, a region where the cooling efficiency is high, that is, a region that may substantially contribute to cooling in the cooling plate 102, also spreads in the outer regions 112S.

The cooling device 52 (see FIG. 2) provided with the cooling plate 102 according to the first embodiment may obtain a structure in which the region having the high cooling efficiency in the cooling plate 102 spreads in the outer regions 112S.

The electronic apparatus 32 (see FIG. 1) provided with the cooling plate 102 according to the first embodiment also has a structure in which the region having the high cooling efficiency in the cooling plate 102 spreads in the outer regions 112S. In the electronic apparatus 32, it is possible to cool the electronic component 64 in a wide area or to cool the electronic component 64 with the cooling plate 102 which is relatively smaller than the cooling plate 72 according to the comparative example.

Next, a second embodiment will be described. For the second embodiment, elements, members, and the like similar to those in the first embodiment are denoted by the same reference signs as those in the first embodiment, thereby omitting the detailed description thereof.

Figure 21:
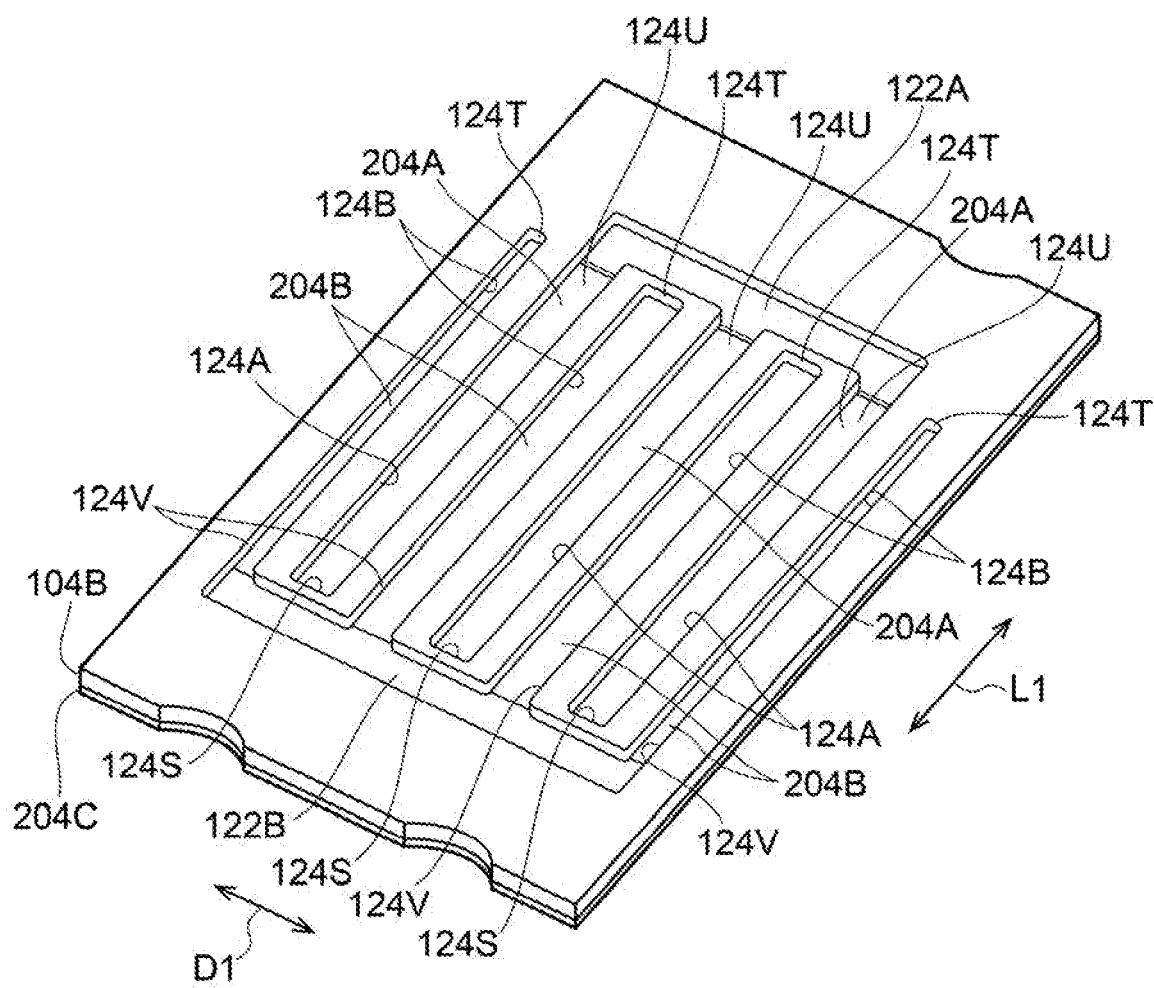
FIG. 21 is a perspective view illustrating layer plates that are a part of a cooling plate according to a second embodiment.

As illustrated in FIG. 21, in a cooling plate 202 according to the second embodiment, a layer plate 204C is used instead of the layer plate 104C (see FIG. 7, FIG. 11, and FIG. 12) in the cooling plate 102 according to the first embodiment.

Figure 22:
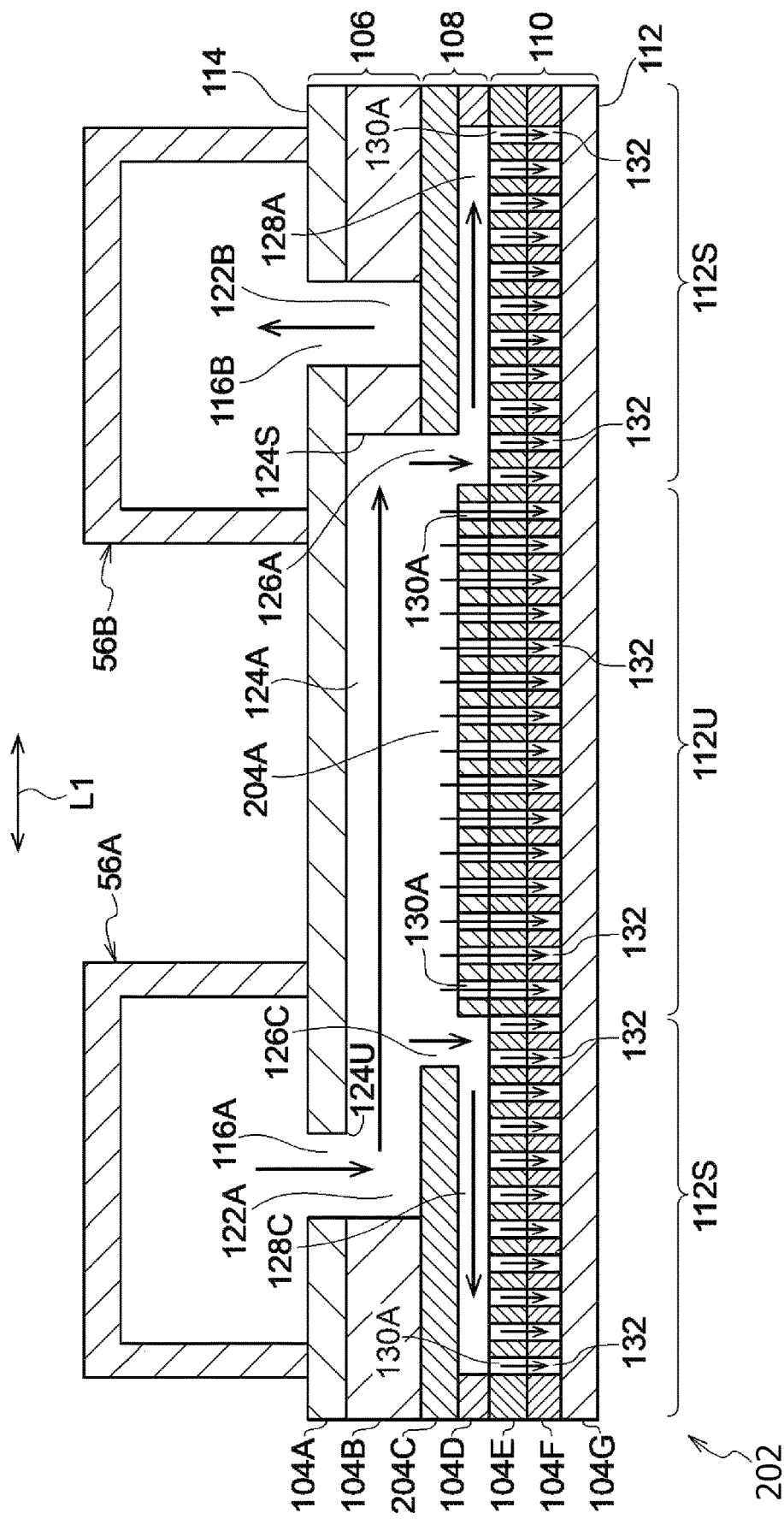
FIG. 22 is a cross-sectional view illustrating the cooling plate according to the second embodiment in a state where covers are attached to the cooling plate.

In the layer plate 204C according to the second embodiment, as illustrated in FIG. 22, first communication portions 204A having a long hole shape which corresponds and continues from a position of the tip end 124S of the first comb tooth flow path 124A to a position of the base end 124U are formed.

In the layer plate 204C according to the second embodiment, as illustrated in FIG. 21, second communication portions 204B are also formed. The second communication portions 204B have a long hole shape extending from a position of the tip end 124T of the second comb tooth flow path 124B to a position of the base end 124V.

Therefore, in the second embodiment, the first vertical flow path 126A and the first vertical flow path 126C are communicated with each other through the first communication portion 204A, and the second vertical flow path 126B and the second vertical flow path 126D are communicated with each other through the second communication portion 204B.

Accordingly, in the cooling plate 202 according to the second embodiment, a cross-sectional area of the first vertical flow path 126A and a cross-sectional area of the first vertical flow path 126C are enlarged by the first communication portion 204A. As a result, refrigerant flows more smoothly from the first comb tooth flow path 124A to the first outer flow path 128A and the first outer flow path 128C. Similarly, a cross-sectional area of the second vertical flow path 126B and a cross-sectional area of the second vertical flow path 126D are enlarged by the second communication portion 204B. As a result, the refrigerant flows more smoothly from the second outer flow path 128B and the second outer flow path 128D to the second comb tooth flow path 124B.

As may be seen from FIG. 22, since the first communication portions 204A are provided in the cooling plate 202 according to the second embodiment, lengths of the first coupling flow paths 130A in the inner region 112U are shortened. In comparison with a structure without the first communication portions 204A, flow path resistance of the first coupling flow paths 130A is small, so that the refrigerant flows smoothly from the first comb tooth flow path 124A to the heat receiving flow paths 132. Similarly, since the second communication portions 204B are provided, lengths of the second coupling flow paths 130B in the inner region 112U are also shortened. In comparison with a structure without the second communication portions 204B, flow path resistance of the second coupling flow paths 130B is small, so that the refrigerant flows smoothly from the heat receiving flow paths 132 to the second comb tooth flow path 124B.

Next, a third embodiment will be described. For the third embodiment, elements, members, and the like similar to those in the first embodiment or the second embodiment are denoted by the same reference signs as those in the first embodiment, thereby omitting the detailed description thereof.

Figure 23:
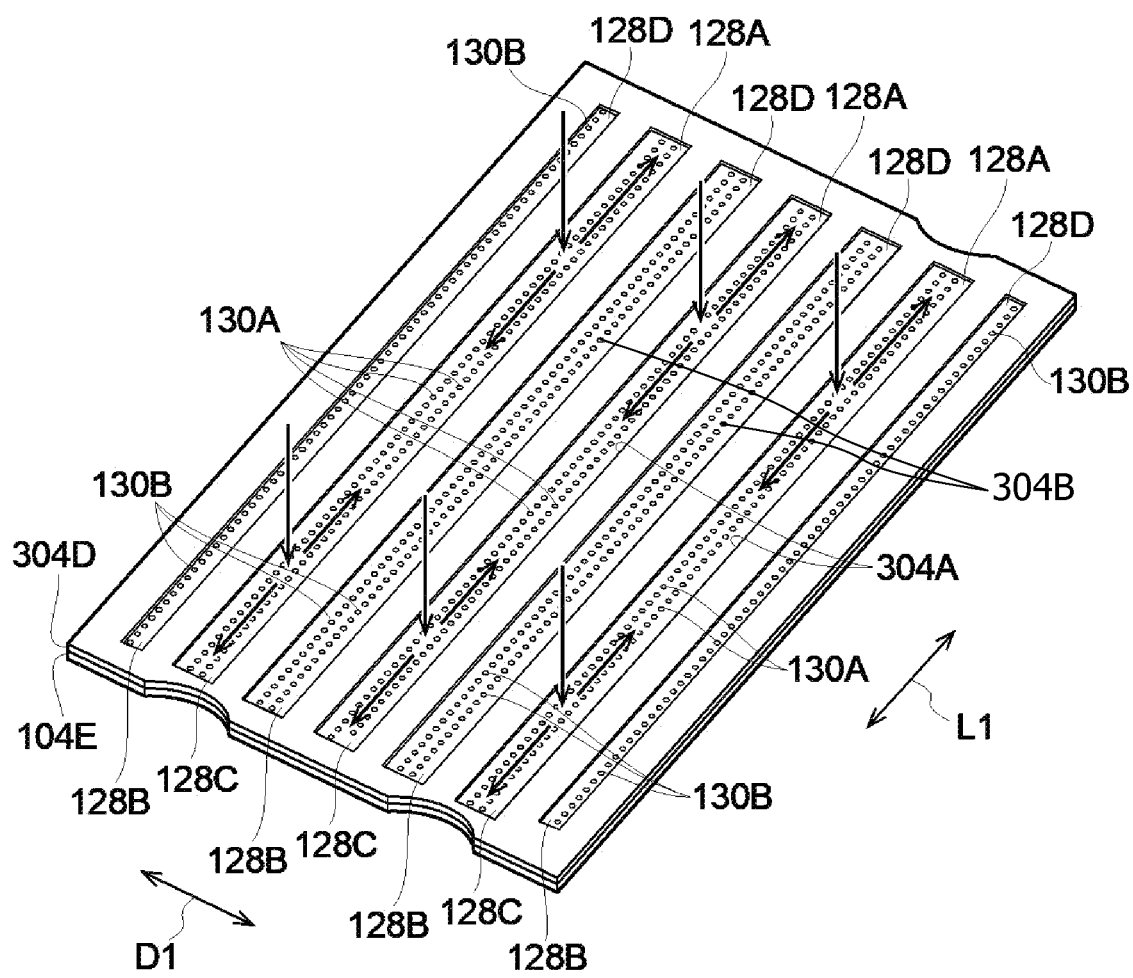
FIG. 23 is a perspective view illustrating layer plates that are a part of a cooling plate according to a third embodiment.

As illustrated in FIG. 23, in a cooling plate 302 according to the third embodiment, a layer plate 304D is used instead of the layer plate 104D (see FIG. 8, FIG. 11, and FIG. 12) in the cooling plate 102 according to the first embodiment.

In the layer plate 304D according to the third embodiment, first communication portions 304A having a long hole shape which corresponds and continues from the position of the tip end 124S of the first comb tooth flow path 124A in the layer plate 1048 to the position of the base end 124U are formed. The first communication portion 304A is positioned between the first vertical flow path 126A and the second vertical flow path 126D, and the first vertical flow path 126A and the first vertical flow path 126C are communicated with each other through the first communication portion 304A in the layer plate 304D.

In the layer plate 304D according to the third embodiment, second communication portions 304B having a long hole shape which corresponds and continues from the position of the tip end 124T of the second comb tooth flow path 124B in the layer plate 1048 to the position of the base end 124U are formed. The second communication portion 304B is positioned between the second vertical flow path 126B and the second vertical flow path 126D, and the second vertical flow path 1268 and the second vertical flow path 126D are communicated with each other through the second communication portion 3048 in the layer plate 304D.

In the cooling plate 302 according to the third embodiment, the first coupling flow path 130A and the second coupling flow path 130B are not formed in the layer plate 104C.

Accordingly, in the cooling plate 302 according to the third embodiment, the first outer flow path 128A and the first outer flow path 128C are communicated with each other through the first communication portion 304A. Since the refrigerant is movable between the first outer flow path 128A and the first outer flow path 128C, flow of the refrigerant from the first comb tooth flow path 124A to the first outer flow path 128A and the first outer flow path 128C may be equalized. Similarly, the second outer flow path 128B and the second outer flow path 128D are communicated with each other through the second communication portion 3048. Since the refrigerant is movable between the second outer flow path 1288 and the second outer flow path 128D, flow of the refrigerant from the second outer flow path 128B and the second outer flow path 128D to the second comb tooth flow path 124B may be equalized.

Figure 24:
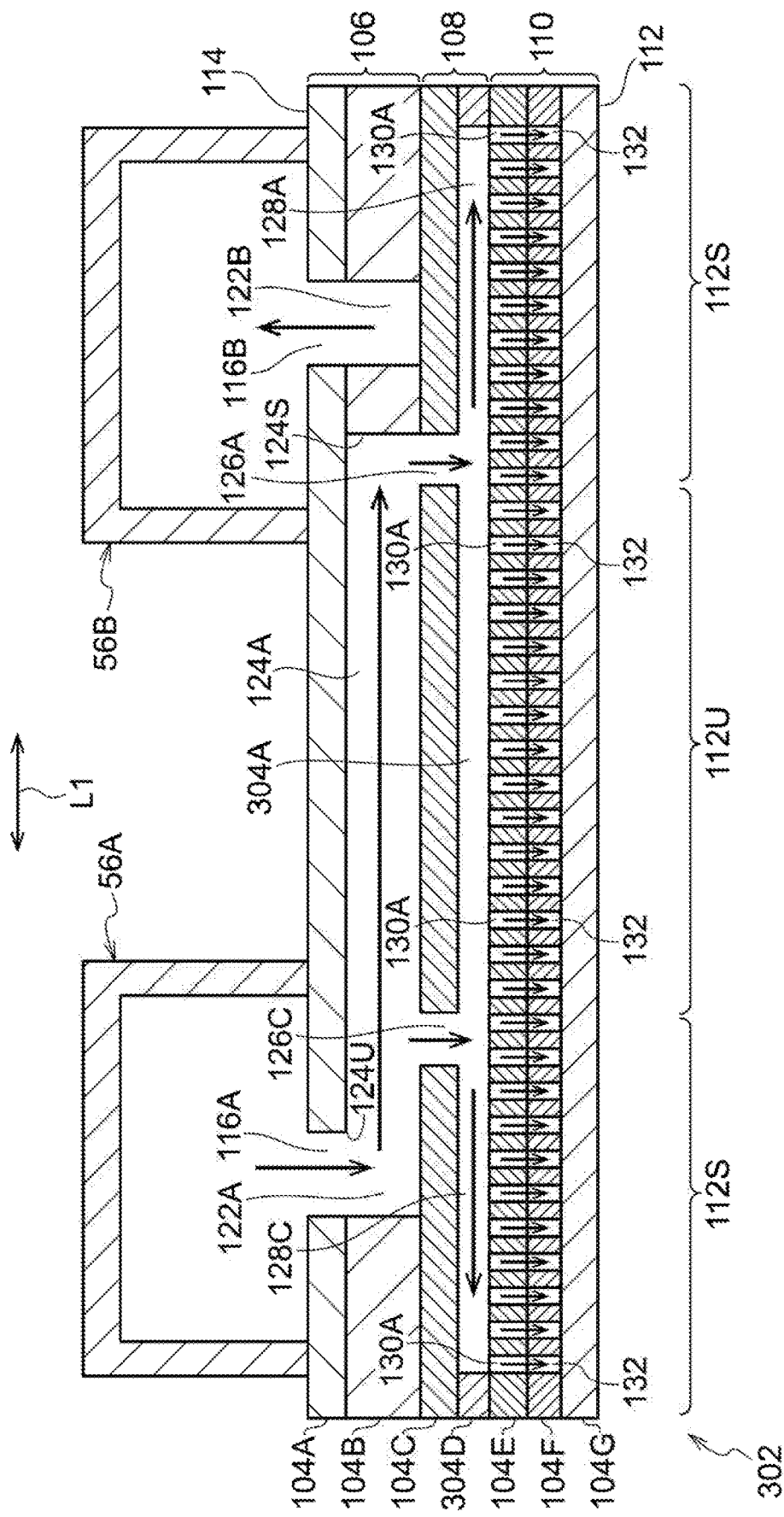
FIG. 24 is a cross-sectional view illustrating the cooling plate according to the third embodiment in a state where covers are attached to the cooling plate.

As may be seen from FIG. 24, since the first communication portions 304A are provided in the cooling plate 302 according to the third embodiment, the first coupling flow paths 130A in the inner region 112U penetrate only the layer plate 104E. That is, for example, substantial lengths of the first coupling flow paths 130A are made to be long. In comparison with a structure without the first communication portions 304A, flow path resistance of the first coupling flow paths 130A is small, so that the refrigerant flows smoothly from the first comb tooth flow path 124A to the heat receiving flow paths 132. Similarly, since the second communication portions 304B are provided, the second coupling flow paths 130B in the inner region 112U penetrate only the layer plate 104E, and substantial lengths of the second coupling flow paths 130B are shortened. In comparison with the structure without the second communication portions 304B, flow path resistance of the second coupling flow paths 130B is small, so that the refrigerant flows smoothly from the heat receiving flow paths 132 to the second comb tooth flow path 124B.

Next, a fourth embodiment will be described. For the fourth embodiment, elements, members, and the like similar to those in the first embodiment or the second embodiment are denoted by the same reference signs as those in the first embodiment, thereby omitting the detailed description thereof.

Figure 25:
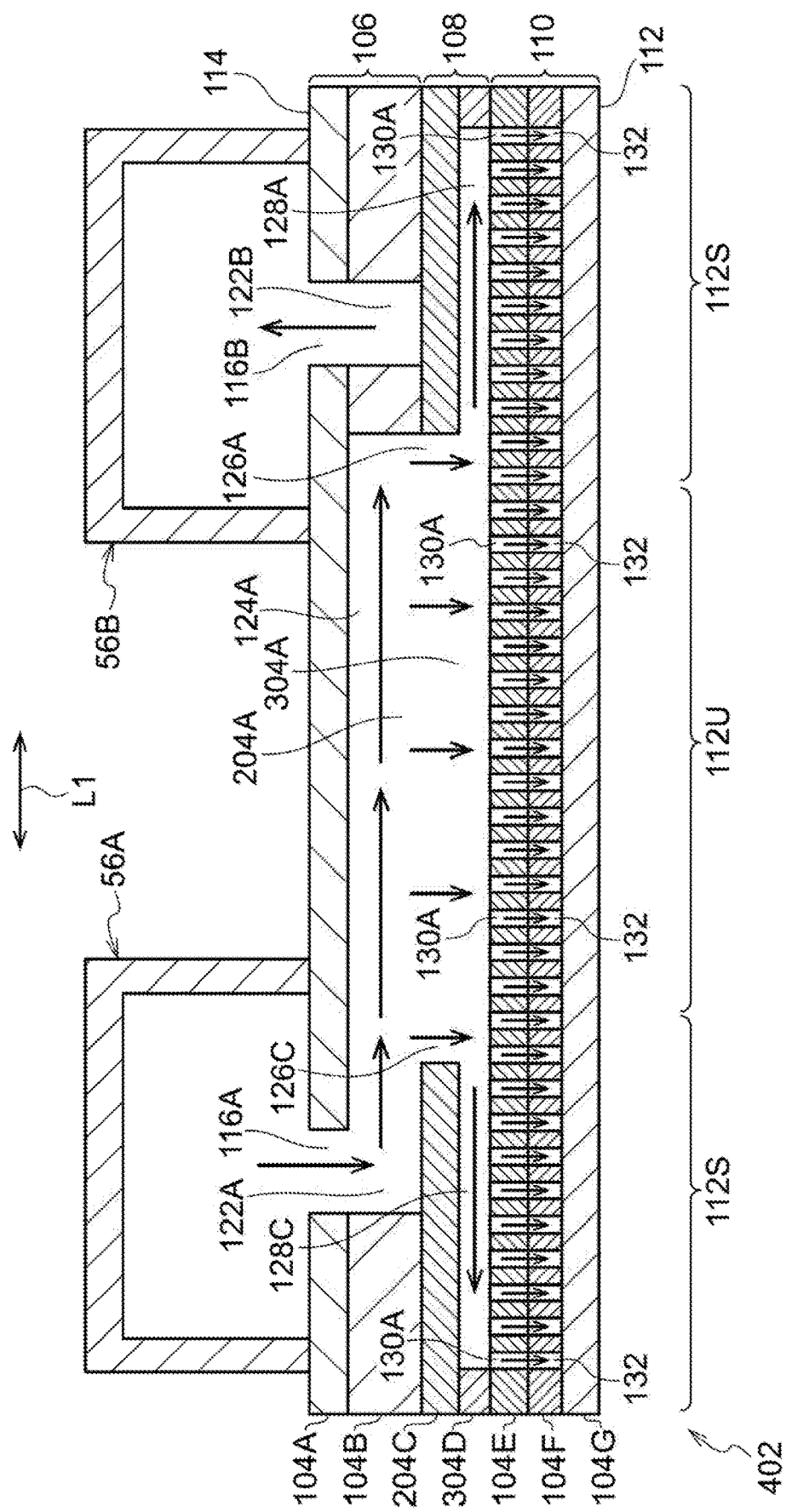
FIG. 25 is a cross-sectional view illustrating a cooling plate according to a fourth embodiment in a state where covers are attached to the cooling plate.

As illustrated in FIG. 25, in a cooling plate 402 according to the fourth embodiment, the layer plate 204C and the layer plate 304D are used instead of the layer plate 104C and the layer plate 104D in the cooling plate 102 according to the first embodiment.

In this manner, the cooling plate 402 according to the fourth embodiment has a structure in which both the layer plate 204C and the layer plate 304D are used. That is, for example, the first vertical flow path 126A at the tip end 124S side of the first comb tooth flow path 124A and the first vertical flow path 126C at the base end 124U side of the first comb tooth flow path 124A are continuously provided. In other words, the cross-sectional area of the first vertical flow path 126A and the cross-sectional area of the first vertical flow path 126C are enlarged by the first communication portion 204A, and are further enlarged by the first communication portion 304A. As a result, refrigerant flows more smoothly from the first comb tooth flow path 124A to the first outer flow path 128A and the first outer flow path 128C. The second vertical flow path 124B at the tip end 124S side of the second comb tooth flow path 126B and the second vertical flow path 126D at the base end 124U side are continuously provided. In other words, the cross-sectional area of the second vertical flow path 126B and the cross-sectional area of the second vertical flow path 126D are enlarged by the second communication portion 204B, and are further enlarged by the second communication portion 304B. As a result, the refrigerant flows more smoothly from the second outer flow path 128B and the second outer flow path 128D to the second comb tooth flow path 124B.

In the cooling plate 402 according to the fourth embodiment, the first communication portions 204A and the first communication portions 304A are provided, so that lengths of the first coupling flow paths 130A in the inner region 112U are shortened. In comparison with a structure without the first communication portion 204A and the first communication portion 304A, flow path resistance of the first coupling flow paths 130A is small, so that the refrigerant flows smoothly from the first comb tooth flow path 124A to the heat receiving flow paths 132. Similarly, since the second communication portions 204B and the second communication portions 304B are provided, lengths of the second coupling flow paths 130B in the inner region 112U are also shortened. In comparison with a structure without the second communication portion 204B and the second communication portion 304B, flow path resistance of the second coupling flow paths 130B is small, so that the refrigerant flows smoothly from the heat receiving flow paths 132 to the second comb tooth flow path 124B.

In the above embodiments, the first outer flow path 128A extends in the same direction as the first comb tooth flow path 124A (in the direction indicated by the arrow S1), and the first outer flow path 128C extends in the opposite direction to the first comb tooth flow path 124A (in the direction indicated by the arrow S2). The second outer flow path 128B extends in the same direction as the second comb tooth flow path 124B (in the direction indicated by the arrow S2), and the second outer flow path 128D extends in the opposite direction to the second comb tooth flow path 124B (the direction indicated by the arrow S1). Thus, a structure is obtained in which the first outer flow paths 128A and the second outer flow paths 128D are alternately adjacent to each other in the outer region 112S, and the second outer flow paths 128B and the first outer flow paths 128C are alternately adjacent to each other in the outer region 112S. That is, for example, in both of the two outer regions 112S, the heat receiving flow paths 132 are provided to allow the refrigerant to flow, so that a structure capable of expanding a region having high cooling efficiency may be obtained.

However, a structure in which any one of the first outer flow path 128A and the first outer flow path 128C, and any one of the second outer flow path 128D and the second outer flow path 128B are provided may be adopted. For example, in one of the two outer regions 112S, the first outer flow path 128A and the second outer flow path 128D correspond to each other (see FIG. 14). That is, for example, even when the first outer flow paths 128C and the second outer flow paths 128B are not provided, the region having the high cooling efficiency may be expanded to one of the outer regions 112S by providing the first outer flow paths 128A and the second outer flow paths 128D.

In the above embodiments, the structure has been exemplified which has two types of the first vertical flow paths that are the first vertical flow path 126A at the tip end 124S side of the first comb tooth flow path 124A, and the first vertical flow path 126C at the base end 124U side of the first comb tooth flow path 124A. A structure having one first vertical flow path may be adopted as long as the refrigerant flows from the first comb tooth flow path 124A to the first outer flow path 128A and the first outer flow path 128C. By providing the two first vertical flow paths 126A and 126C, the refrigerant flows more reliably from the first comb tooth flow path 124A to the respective first outer flow paths 128A and 128C.

Similarly, the structure has been exemplified which has two types of the second vertical flow paths that are the second vertical flow path 126B at the tip end 124S side of the second comb tooth flow path 124B and the second vertical flow path 126D at the base end 124U side of the second comb tooth flow path 124B. However, a structure having one second vertical flow path may be adopted as long as the refrigerant flows from the second outer flow path 128B and the second outer flow path 128D to the second comb tooth flow path 124B. By providing the two second vertical flow paths 126B and 126D, the refrigerant flows more reliably from the respective second outer flow paths 128B and 128D to the second comb tooth flow path 124B.

In the above embodiments, as illustrated in FIG. 13, the first comb tooth flow paths 124A and the second comb tooth flow paths 124B are alternately adjacent to each other. As illustrated in FIG. 14 and FIG. 15, the first outer flow paths 128A and the second outer flow paths 128D are alternately adjacent to each other, and the first outer flow paths 128C and the second outer flow paths 128B are adjacent to each other. Therefore, it is possible to easily obtain a structure in which the heat receiving flow paths 132 are densely arranged.

In the above embodiments, as illustrated in FIG. 14, the first vertical flow path 126A and the second vertical flow path 126D are alternately adjacent to each other. As illustrated in FIG. 15, the first vertical flow paths 126C and the second vertical flow paths 126B are alternately adjacent to each other. As described above, the first vertical flow paths and the second vertical flow paths are arranged adjacent to each other to allow the refrigerant to more evenly flow in the first outer flow paths 128A and 128C, and the second outer flow paths 128B and 128D.

In the embodiments described above, the long holes 116A and 116B are provided over the top surface 114 (a surface opposite to the heat receiving surface 112) of the cooling plate 102. That is, for example, the first common flow path 122A and the second common flow path 122B are opened to the top surface 114, and the refrigerant enters and exits the cooling plate 102 through the opening. The entrance and exit of the refrigerant is provided in a side surface of the cooling plate 102, for example, so that a cross-sectional area of the opening may be widely secured.

The covers 56A and 56B that cover the long holes 116A and 116B from the peripheries and allow the refrigerant to enter and exit are attached to the top surface 114. Since the top surface 114 has a larger area than the side surface in the cooling plate 102, the covers 56A and 56B may be firmly fixed by using the wide area of the cooling plate 102.

Since the covers 56A and 56B are not attached to the side surface of the cooling plate, the covers 56A and 56B do not project to the outside of the cooling plate. That is, for example, it is possible to arrange the cooling plate in a narrower area in a plan view (in a view in the direction indicated by the arrow A1).

Figure 26:
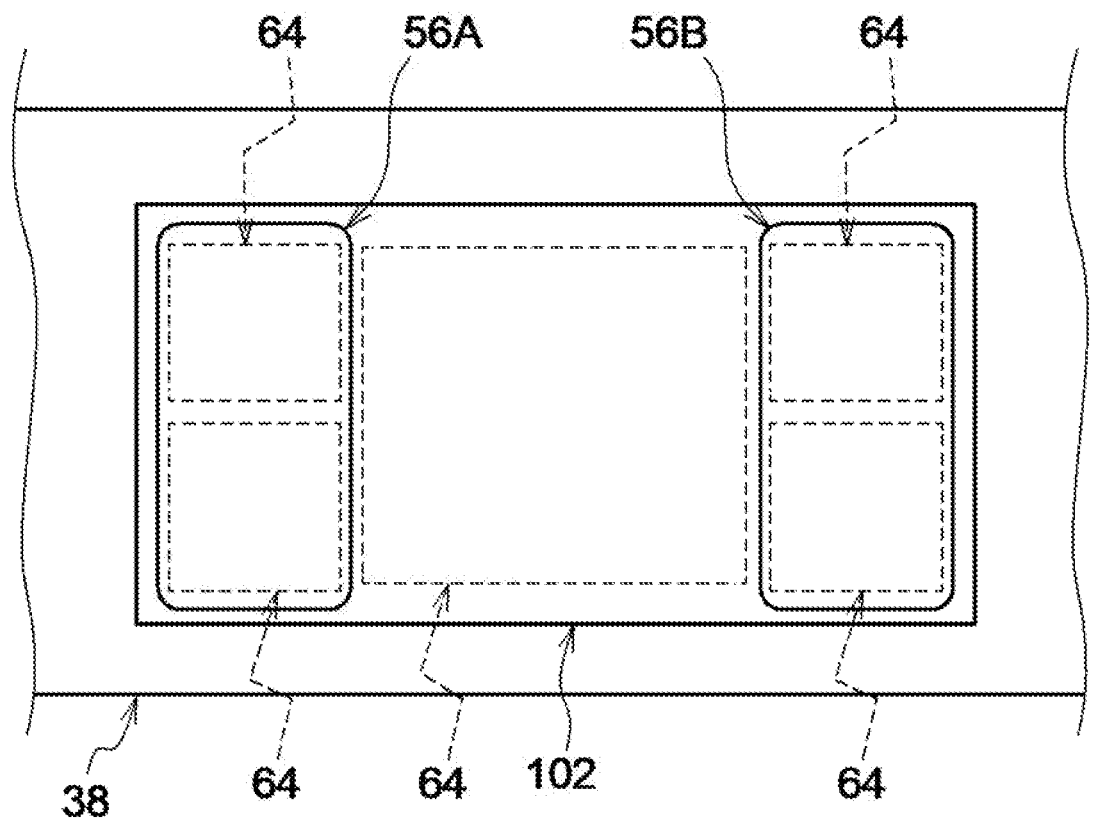
FIG. 26 is a plan view illustrating the cooling plate according to the first embodiment together with a part of an electronic apparatus different from that of FIG. 3.
Figure 27:
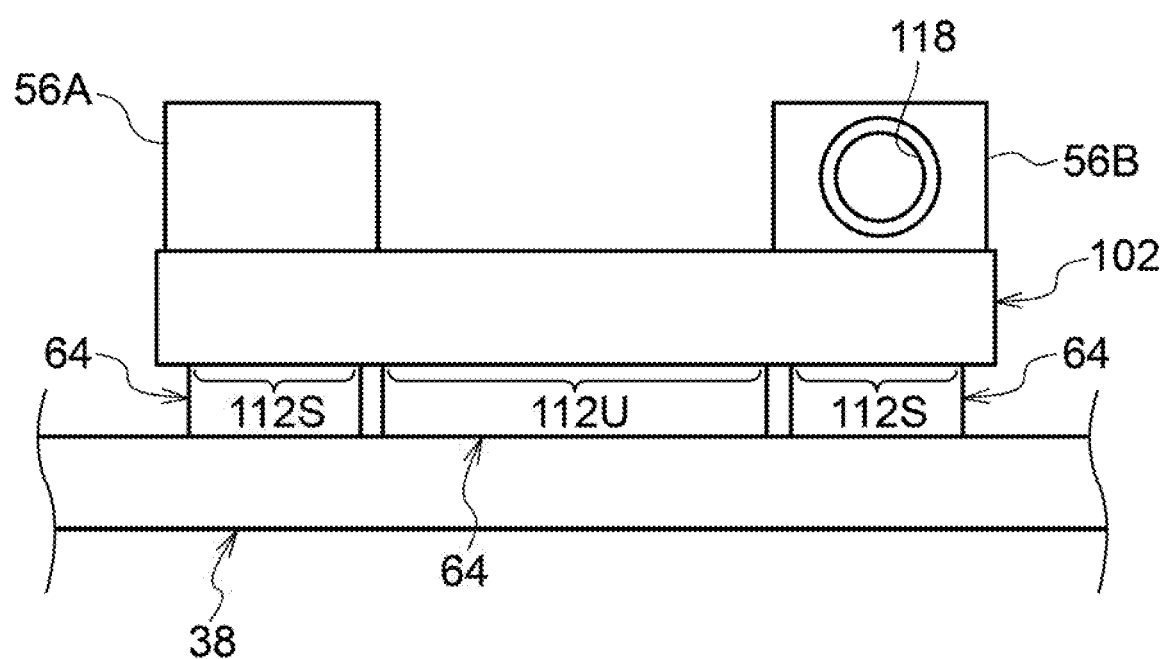
FIG. 27 is a front view illustrating the cooling plate according to the first embodiment together with a part of an electronic apparatus different from that of FIG. 4.

In the above embodiments, the region having the high cooling efficiency in the heat receiving surface 112 extends not only to the inner region 112U but also to the outer regions 112S. Accordingly, as illustrated in FIG. 26 and FIG. 27, not only the electronic component 64 may be in contact with the inner region 112U and be cooled, but also the electronic component 64 may be in contact with the outer region 112S and be cooled. As an example, a structure may be adopted in which a processor chip is in contact with the inner region 112U, and a memory chip such as a High Bandwidth Memory (HBM) is in contact with the outer region 112S.

In other words, the area having sufficient cooling efficiency in each of the cooling plates according to the above embodiments may be obtained even when the area is narrower than that of the cooling plate 72 in the comparative example in a plan view. Each of the layer plates 104A to 104G of the cooling plate is manufactured by, for example, being divided into a plurality of sheets having a predetermined size by etching or the like from a large-size plate material, and the number of the layer plates 104A to 104G obtained from the plate material is larger than that of the cooling plate 72 according to the comparative example. Therefore, it is possible to reduce the manufacturing cost of the cooling plate 102.

Examples of the electronic apparatus 32 in the present application include a server, various computers, a signal conversion apparatus, a signal switching apparatus, and the like.

Although the embodiments of the technique disclosed herein have been described, the technique disclosed herein is not limited to the above description. Of course, in addition to the above description, the technique disclosed herein is able to be varied in a variety of manners and embodied without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling plate comprising:
   first comb tooth flow paths extending from a first common flow path toward an inside of a flat surface parallel to a heat receiving surface in a comb-teeth shape;
   second comb tooth flow paths extending from a second common path toward the inside of the flat surface in a comb-teeth shape and being alternately adjacent to the first comb tooth flow paths;
   first vertical flow paths each of which extends from a representative one of the first comb tooth flow paths toward a side of the heat receiving surface;
   second vertical flow paths each of which extends from a representative one of the second comb tooth flow paths toward the side of the heat receiving surface;
   first outer flow paths each of which extends from a representative one of the first vertical flow paths toward an outside of the flat surface;
   second outer flow paths each of which extends from a representative one of the second vertical flow paths toward the outside of the flat surface and that are alternately adjacent to the first outer flow path;
   first coupling flow paths each of which extends from a representative one of the first comb tooth flow paths or a representative one of the first outer flow paths toward the side of the heat receiving surface;
   second coupling flow paths each of which extends from a representative one of the second comb tooth flow paths or a representative one of the second outer flow paths toward the side of the heat receiving surface and that are alternately adjacent to the first coupling flow path; and
   heat receiving flow paths each of which communicates with a representative one of the first coupling flow paths and a representative one of the second coupling flow paths to receive heat of the heat receiving surface.

2. The cooling plate according to claim 1, wherein the first vertical flow paths and the second vertical flow paths are alternately adjacent to each other.

3. The cooling plate according to claim 2, wherein the first vertical flow paths are individually provided on a tip end side and a base end side of the first comb tooth flow path, and
   the second vertical flow paths are individually provided on a tip end side and a base end side of the second comb tooth flow path.

4. The cooling plate according to claim 1, further comprising:
   a comb tooth flow path plate provided with the first comb tooth paths and the second comb tooth paths;
   an outer flow path plate that is provided with the first vertical flow paths, the second vertical flow paths, the first outer flow paths and the second outer flow paths and that is laminated to the comb tooth flow path plate; and
   a heat receiving plate that is provided with the first coupling flow paths, the second coupling flow paths, and the heat receiving flow paths, that is laminated to the outer flow path plate with the comb tooth flow path plate being laminated to an opposite side, and that includes the heat receiving surface.

5. A cooling device comprising:
   a cooling plate, the cooling plate including:
   first comb tooth flow paths extending from a first common flow path toward an inside of a flat surface parallel to a heat receiving surface in a comb-teeth shape,
   second comb tooth flow paths extending from a second common path toward the inside of the flat surface in a comb-teeth shape and being alternately adjacent to the first comb tooth flow paths,
   first vertical flow paths each of which extends from a representative one of the first comb tooth flow paths toward a side of the heat receiving surface,
   second vertical flow paths each of which extends from a representative one of the second comb tooth flow paths toward the side of the heat receiving surface,
   first outer flow paths each of which extends from a representative one of the first vertical flow paths toward an outside of the flat surface,
   second outer flow path each of which extends from a representative one of the second vertical flow paths toward the outside of the flat surface and that are alternately adjacent to the first outer flow path,
   first coupling flow paths each of which extends from a representative one of the first comb tooth flow paths or a representative one of the first outer flow paths toward the side of the heat receiving surface,
   second coupling flow paths each of which extends from a representative one of the second comb tooth flow paths or a representative one of the second outer flow paths toward the side of the heat receiving surface and that are alternately adjacent to the first coupling flow path, and
   heat receiving flow paths each of which communicates with a representative one of the first coupling flow paths and a representative one of the second coupling flow paths to receive heat of the heat receiving surface; and a circulation device configured to circulate refrigerant in the first common flow path and the second common flow path.

6. An electronic apparatus comprising:

a cooling plate, the cooling plate including:
- first comb tooth flow paths extending from a first common flow path toward an inside of a flat surface parallel to a heat receiving surface in a comb-teeth shape,
- second comb tooth flow paths extending from a second common path toward the inside of the flat surface in a comb-teeth shape and being alternately adjacent to the first comb tooth flow paths,
- first vertical flow paths each of which extends from a representative one of the first comb tooth flow paths toward a side of the heat receiving surface,
- second vertical flow paths each of which extends from a representative one of the second comb tooth flow paths toward the side of the heat receiving surface,
- first outer flow paths each of which extends from a representative one of the first vertical flow paths toward an outside of the flat surface,
- second outer flow paths each of which extends from a representative one of the second vertical flow paths toward the outside of the flat surface and that are alternately adjacent to the first outer flow path,
- first coupling flow paths each of which extends from a representative one of the first comb tooth flow paths or a representative one of the first outer flow paths toward the side of the heat receiving surface,
- second coupling flow paths each of which extends from a representative one of the second comb tooth flow paths or a representative one of the second outer flow paths toward the side of the heat receiving surface and that are alternately adjacent to the first coupling flow path, and
- heat receiving flow path each of which communicates with a representative one of the first coupling flow paths and a representative one of the second coupling flow paths to receive heat of the heat receiving surface;

a circulation device configured to circulate refrigerant in the first common flow path and the second common flow path; and an electronic component arranged opposite to the heat receiving surface.

* * * * *